US011552338B2

(12) United States Patent
Marsili et al.

(10) Patent No.: US 11,552,338 B2
(45) Date of Patent: Jan. 10, 2023

(54) METHOD OF MONITORING A BATTERY, MONITORING SYSTEM AND MONITORING CIRCUIT

(71) Applicant: Infineon Technologies AG, Neubiberg (DE)

(72) Inventors: Stefano Marsili, Faak am See (AT); Andreas Berger, Klagenfurt (AT); Klaus Hoermaier, Krumpendorf (AT); Guenter Hofer, St. Oswald (AT); Christoph Sandner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 17/156,010

(22) Filed: Jan. 22, 2021

(65) Prior Publication Data

US 2021/0151806 A1 May 20, 2021

Related U.S. Application Data

(63) Continuation of application No. 16/245,700, filed on Jan. 11, 2019, now Pat. No. 10,944,133.

(30) Foreign Application Priority Data

Jan. 12, 2018 (DE) .......................... 102018100692.6

(51) Int. Cl.
*H01M 10/42* (2006.01)
*H01M 10/48* (2006.01)
(Continued)

(52) U.S. Cl.
CPC ........ *H01M 10/425* (2013.01); *G01R 31/382* (2019.01); *G01R 31/389* (2019.01);
(Continued)

(58) Field of Classification Search
CPC ............... H01M 10/425; H01M 10/48; H01M 10/482; H01M 2010/4271;
(Continued)

(56) References Cited

U.S. PATENT DOCUMENTS

| 5,877,640 A * | 3/1999 | Geerlings | ................ H04N 5/93 |
| | | | 386/E5.028 |
| 6,002,238 A | 12/1999 | Champlin | |
| 7,184,480 B1 * | 2/2007 | Gheorghiu | ............... H03K 7/08 |
| | | | 375/353 |
| 10,530,373 B1 * | 1/2020 | Fridi | .................... H04B 1/0028 |

(Continued)

FOREIGN PATENT DOCUMENTS

| CN | 1558253 A | 12/2004 |
| CN | 104678307 A | 6/2015 |

(Continued)

OTHER PUBLICATIONS

Wang, Li, "Fuel cell of condition monitoring and fault diagnosis system research", Chinese Selected Doctoral Dissertations and Master's Theses Full-Text Databases, Sep. 15, 2004, 57 pages.

*Primary Examiner* — Akm Zakaria
(74) *Attorney, Agent, or Firm* — Slater Matsil, LLP

(57) ABSTRACT

In accordance with an embodiment, a method includes receiving, by at least one of a plurality of battery monitoring circuits a frequency synchronization signal and measurement frequency information from a host controller, wherein the at least one of the plurality of battery monitoring circuits is connected to at least one of a plurality of battery blocks; generating, by the at least one of the plurality of battery monitoring circuits, a periodic signal based on a clock signal having a clock frequency, the measurement frequency information, and the frequency synchronization signal; obtaining, by the at least one of the plurality of battery monitoring circuits, at least one measurement value of the at least one (Continued)

of the plurality of battery blocks using the periodic signal; and transmitting, by the at least one of the plurality of battery monitoring circuits, the at least one measurement value to the host controller.

22 Claims, 18 Drawing Sheets

(51) Int. Cl.
*G01R 31/389* (2019.01)
*G01R 31/396* (2019.01)
*G01R 31/382* (2019.01)

(52) U.S. Cl.
CPC .......... *G01R 31/396* (2019.01); *H01M 10/48* (2013.01); *H01M 10/482* (2013.01); *H01M 2010/4271* (2013.01); *H01M 2010/4278* (2013.01)

(58) Field of Classification Search
CPC ......... H01M 2010/4278; G01R 31/382; G01R 31/389; G01R 31/396; G01R 31/3842; G01R 27/08; Y02E 60/10
See application file for complete search history.

(56) References Cited

U.S. PATENT DOCUMENTS

| | | | |
|---|---|---|---|
| 2004/0199343 A1 | 10/2004 | Cardinal et al. | |
| 2005/0221870 A1 | 10/2005 | Erdelyi et al. | |
| 2009/0278545 A1* | 11/2009 | Magana | G01R 15/04 324/426 |
| 2011/0316548 A1 | 12/2011 | Ghantous et al. | |
| 2013/0293995 A1 | 11/2013 | Brown et al. | |
| 2014/0009090 A1* | 1/2014 | Ashida | B60L 3/0038 318/139 |
| 2015/0102943 A1* | 4/2015 | de Greef | B60L 58/21 324/426 |
| 2017/0168118 A1* | 6/2017 | Rotem | G01R 21/133 |
| 2019/0242949 A1* | 8/2019 | Lemkin | H04Q 9/04 |
| 2022/0206077 A1* | 6/2022 | McCartney | H02J 7/005 |

FOREIGN PATENT DOCUMENTS

| | | |
|---|---|---|
| CN | 104898068 A | 9/2015 |
| CN | 105375075 A | 3/2016 |
| CN | 105824232 A | 8/2016 |
| EP | 1675266 A2 | 6/2006 |
| JP | 2012154641 A | 8/2012 |

\* cited by examiner

METHOD OF MONITORING A BATTERY, MONITORING SYSTEM AND MONITORING CIRCUIT

This application is a continuation of U.S. patent application Ser. No. 16/245,700, filed Jan. 11, 2019, which application claims the benefit of German Patent Application No. 102018100692.6, filed on Jan. 12, 2018, which applications are hereby incorporated herein by reference in its entirety.

TECHNICAL FIELD

This disclosure relates in general to monitoring a battery. In particular, this disclosure relates to a method for monitoring a battery, a battery monitoring system, and a monitoring circuit.

BACKGROUND

The complex impedance of a battery, such as a lithium-ion (Li-ion) battery, may be used to obtain information on the status of the battery. This information may include a temperature, charging state or information on a deterioration, to name only a few. Obtaining this information based on the impedance makes use of the fact that the impedance varies as the frequency of a current driven into the battery or drawn from the battery varies. Detecting the status of the battery may include successively driving alternating currents with different frequencies into the battery, measuring the complex impedance of the battery at each of the different frequencies, and detecting the status based on a variation of the complex resistance over the frequency.

Obtaining status information of the battery based on the impedance requires reliably measuring the impedance.

SUMMARY

One example relates to a method. The method includes: receiving, by at least one of a plurality of battery monitoring circuits, a frequency synchronization signal and a measurement frequency information from a host controller, wherein the at least one of the plurality of battery monitoring circuits is connected to at least one of a plurality of battery blocks; generating, by the at least one of the plurality of battery monitoring circuits, a periodic signal based on a clock signal having a clock frequency, the measurement frequency information, and the frequency synchronization signal; obtaining, by the at least one of the plurality of battery monitoring circuits, at least one measurement value of the at least one of the plurality of battery blocks using the periodic signal; and transmitting, by the at least one of the plurality of battery monitoring circuits, the at least one measurement value to the host controller. The frequency synchronization signal includes at least one pair of time marks defining a synchronization time period, and generating the periodic signal based on the clock signal includes compensating for a deviation of the clock frequency from a nominal clock frequency using the synchronization time period and information regarding a duration of the synchronization time period.

Another example relates to a system. The system includes: a plurality of monitoring circuits each configured to be connected to at least one respective battery block; and a host controller configured to generate a frequency synchronization signal comprising at least one pair of time marks defining a synchronization time period and to generate a measurement frequency information. The at least one of the plurality of monitoring circuits is configured to receive the frequency synchronization signal and the measurement frequency information from the host controller, to generate a periodic signal based on a clock signal having a clock frequency, the measurement frequency information, and the frequency synchronization signal, to obtain at least one measurement value of the at least one respective battery block using the periodic signal, and to transmit the at least one measurement value to the host controller. The at least one of the plurality of monitoring circuits is further configured to compensate for a deviation of the clock frequency from a nominal clock frequency using the synchronization time period and information regarding a duration of the synchronization time period.

Yet another example relates to a monitoring circuit. The monitoring circuit is configured to be connected to at least one battery block; to receive, from a host controller, a measurement frequency information and a frequency synchronization signal including at least one pair of time marks defining a synchronization time period; to generate a periodic signal based on a clock signal having a clock frequency, the measurement frequency information, and the frequency synchronization signal; to obtain at least one measurement value of the at least one battery block using the periodic signal; and to transmit the at least one measurement value to the host controller. The monitoring circuit is further configured to compensate for a deviation of the clock frequency from a nominal clock frequency using the synchronization time period and information regarding a duration of the synchronization time period.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
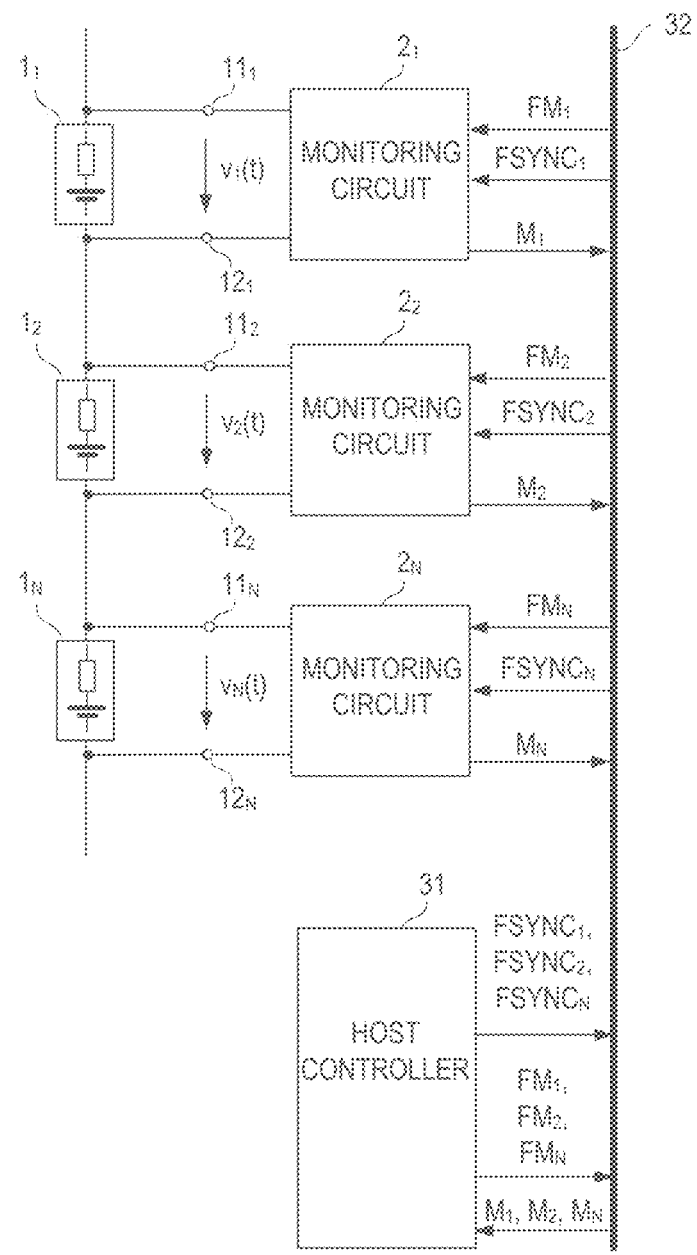
FIG. 1 schematically illustrates one example of a battery monitoring system having a plurality of monitoring circuits and a host controller.

FIG. 1 schematically illustrates one example of a battery monitoring system. The battery monitoring system includes a plurality of monitoring circuits $2_1$-$2_N$ and a host controller 31. Each of the monitoring circuits $2_1$-$2_N$ is configured to be coupled to at least one of a plurality of battery blocks $1_1$-$1_N$ of a battery. According to one example, these battery blocks $1_1$-$1_N$ are connected in series. In the example shown in FIG. 1, each of the plurality of monitoring circuits $2_1$-$2_N$ is connected to exactly one battery block $1_1$-$1_N$. This, however, is only an example. According to another example explained herein further below, one monitoring circuit may be connected to two or more of the battery blocks $1_1$-$1_N$.

The host controller 31 is in communication with each of the monitoring circuits $2_1$-$2_N$ via a communication channel 32. Through the communication channel 32, the host controller 31 can transmit signals to each of the monitoring circuits $2_1$-$2_N$ and can receive signals from each of the monitoring circuits $2_1$-$2_N$. The communication channel 32 is only schematically illustrated in FIG. 1 by a bold line. Any type of communication channel suitable to transmit signals from a host controller to a plurality of monitoring circuits and from the monitoring circuit to the host controller may be used to implement the communication channel 32 shown in FIG. 1. According to one example, the communication channel 32 includes a plurality of dedicated transmission channels, with each of these transmission channels being used for the communication between exactly one of the plurality of monitoring circuits $2_1$-$2_N$ and the host controller 31. The individual transmission channels can be wireline or wireless transmission channels. According to another example, the communication channel 32 includes a signal bus to which each of the monitoring circuits $2_1$-$2_N$ and the host controller 31 are connected. Signals transmitted over such signal bus may include data packets, wherein each data packet includes a header carrying information on the addressee of the respective data packet and a payload information. The "addressee", for example, is either one of the monitoring circuits $2_1$-$2_N$ that is to receive a data packet from the host controller, or the host controller that is to receive a data packet from one of the monitoring circuits $2_1$-$2_N$. One data packet may be directed to several addressees, so that the host controller 31, for example, can send the same payload information to two or more of the monitoring circuits $2_1$-$2_N$.

The communication channel 32 may be implemented such that the host controller 31 can directly communicate with each of the monitoring circuits $2_1$-$2_N$. According to another example, the communication channel 32 is such that it includes a plurality of channel sections, wherein each of these channel sections either connects two of the monitoring circuits $2_1$-$2_N$ with each other, or connects the host controller 31 with one of the monitoring circuits $2_1$-$2_N$. In a monitoring system having this type of channel, only the two parties that are connected by a channel section can directly communicate with each other. Further, in this type of monitoring system, the individual monitoring circuits $2_1$-$2_N$ are part of the communication channel and each of the monitoring circuits $2_1$-$2_N$ includes a communication interface with a "repeater". The communication interface of one monitoring circuit 2 (wherein "2" denotes an arbitrary one of the monitoring circuits $2_1$-$2_N$) receives data packets via the channel section it is connected to. Based on the address information included in each data packet, the monitoring circuit 2 decides whether to process the respective data packet, or to forward the data packet on the channel. The host controller 31, for example, may directly communicate with monitoring circuit $2_N$, but indirectly communicate with monitoring circuit $2_2$ via intermediate monitoring circuit $2_N$. That is, the host controller 31 may forward a data packet intended for monitoring circuit $2_2$ to monitoring circuit $2_N$, wherein monitoring circuit $2_N$ receives the data packet, detects that it is not addressee and forwards the data packet to the next monitoring circuit in the chain. In the example shown in FIG. 1, the next monitoring circuit as seen from monitoring circuit $2_N$, is monitoring circuit $2_2$ which, in this example, is the correct addressee. Based on this channel concept, a ring bus may be formed. In the example shown in FIG. 1, a ring bus would connect host controller 31 with two monitoring circuits such as, for example, monitoring circuit $2_N$ and monitoring circuit $2_1$.

The communication channel may include two or more sub-channels connected in parallel so that the host controller 31 can send and the monitoring circuits $2_1$-$2_N$ can receive two or more data packets at the same time.

Figure 2:
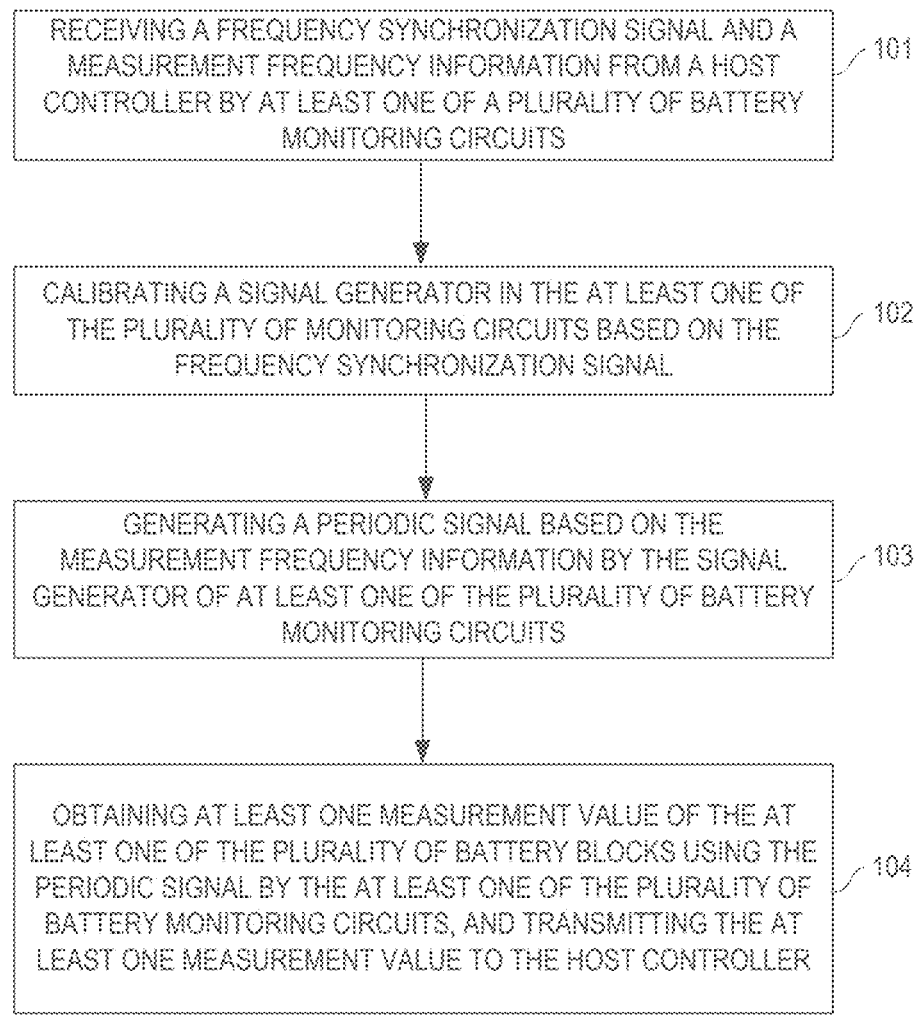
FIG. 2 is a flowchart that illustrates one example of a method for operating a battery monitoring system of the type shown in FIG. 1.

FIG. 2 shows a flowchart that illustrates an operating method of the battery monitoring system shown in FIG. 1.

Referring to FIG. 2, this method includes receiving, from the host controller 31, a frequency synchronization signal by at least one of the plurality of battery monitoring circuits $2_1$-$2_N$ (which is also referred to as the at least one of the monitoring circuits $2_1$-$2_N$ in the following), see process step 101. In the example shown in FIG. 1, a frequency synchronization signal $FSYNC_1$-$FSYNC_N$ is received by each of the monitoring circuits $2_1$-$2_N$. The monitoring circuits $2_1$-$2_N$ may receive the same frequency synchronization signal, that is, the frequency synchronization signals $FSYNC_1$-$FSYNC_N$ are identical. According to another example, the monitoring circuits $2_1$-$2_N$ receive different frequency synchronization signals, that is, the frequency synchronization signals $FSYNC_1$-$FSYNC_N$ are distinct.

Further, referring to FIG. 2, the at least one of the plurality of battery monitoring circuits $2_1$-$2_N$ receives, from the host controller 31, measurement frequency information $FM_1$-$FM_N$. This measurement frequency information may be transmitted by the host controller 31 to the at least one of the monitoring circuits $2_1$-$2_N$ using data packets as explained above. In the example shown in FIG. 1, each of the battery monitoring circuits $2_1$-$2_N$ receives corresponding measurement frequency information $FM_1$-$FM_N$ from the host controller 31, wherein the measurement frequency information $FM_1$-$FM_N$ represents a measurement frequency explained herein further below.

Referring to FIG. 2, the method further includes calibrating a signal generator in the at least one of the plurality of monitoring circuits $2_1$-$2_N$ based on the frequency synchronization signal $FSYNC_1$-$FSYNC_N$, see step 102, and generating a periodic signal by the calibrated signal generator based on the measurement frequency information $FM_1$-$FM_N$. See step 103. More specifically, the signal generator in the at least one of the monitoring circuits $2_1$-$2_N$ generates the periodic signal such that a frequency of the periodic signal is dependent on the measurement frequency $FM_1$-$FM_N$ information received from the host controller 31.

Referring to FIG. 2, the method further includes obtaining, by the at least one of the monitoring circuits $2_1$-$2_N$, at least one measurement value related to the at least one associated battery block $1_1$-$1_N$. The "at least one associated battery block" is the at least one of the plurality of battery blocks $1_1$-$1_N$ that is connected to the at least one of the monitoring circuits $2_1$-$2_N$ that receives the frequency synchronization signal $FSYNC_1$-$FSYNC_N$ and the frequency information $FM_1$-$FM_N$. Obtaining the measurement value includes using the periodic signal generated by the signal generator in the at least one of the monitoring circuits $2_1$-$2_N$. Further, the at least one of the monitoring circuits $2_1$-$2_N$ transmits the obtained measurement value to the host controller 31. In the example shown in FIG. 1, in which each of the monitoring circuits $2_1$-$2_N$ receives a frequency synchronization signal $FSYNC_1$-$FSYNC_N$ and measurement frequency information $FM_1$-$FM_N$, each of the monitoring circuits $2_1$-$2_N$ obtains a measurement value $M_1$-$M_N$ of the associated battery block $1_1$-$1_N$ and transmits the measurement value $M_1$-$M_N$ to the host controller 31.

FIG. 1 is a schematic representation that shows which kind of signals or information are exchanged between the host controller 31 and the monitoring circuits $2_1$-$2_N$. FIG. 1 does not illustrate a timing of exchanging these signals or information. According to one example, each of the frequency synchronization signals $FSYNC_1$-$FSYNC_N$ includes a plurality of data packets that may be periodically or aperiodically generated by the host controller 31 and received by the monitoring circuits $2_1$-$2_N$ throughout the measurement process. The measurement frequency $FM_1$-$FM_N$ may be transmitted only once at the beginning of each measurement process.

The at least one of the monitoring circuits $2_1$-$2_N$ that receives the frequency synchronization signal and the measurement frequency information $FM_1$-$FM_N$ may repeat the measurement process explained with reference to FIG. 2 several times. In this case, the host controller 31 sends new measurement frequency information at the beginning of each measurement process (which is also referred to as measurement cycle in the following), and the at least one of the monitoring circuits $2_1$-$2_N$ sends a measurement value associated with the measurement frequency information $FM_1$-$FM_N$ to the host controller 31 at the end of each measurement cycle.

In the example shown in FIG. 1, in which each of the monitoring circuits $2_1$-$2_N$ receives frequency measurement information $FM_1$-$FM_N$ from the host controller 31, the individual monitoring circuits $2_1$-$2_N$ may receive frequency measurement information $FM_1$-$FM_N$ that represent the same measurement frequency at one time so that, at one time, each monitoring circuit $2_1$-$2_N$ measures at the same frequency. This, however, is only an example. According to another example, the monitoring circuits $2_1$-$2_N$ may measure at different frequencies at the same time.

The battery is a lithium-ion (Li-Ion) battery, for example. Each of the battery blocks $1_1$-$1_N$ includes a first battery block node $11_1$-$11_N$ and a second battery block node $12_1$-$12_N$ configured to connect the battery block $1_1$-$1_N$ to the associated one of the monitoring circuits $2_1$-$2_N$. Each of these battery blocks $1_1$-$1_N$ includes at least one battery cell. Different examples of how the battery blocks $1_1$-$1_N$ may be implemented are illustrated in FIGS. 3A-3D. In these figures, reference number 1 denotes an arbitrary one of the battery blocks $1_1$-$1_N$ shown in FIG. 1, and reference numbers 11, 12 denote the first and second battery block node of the battery block 1.

Figure 3A:
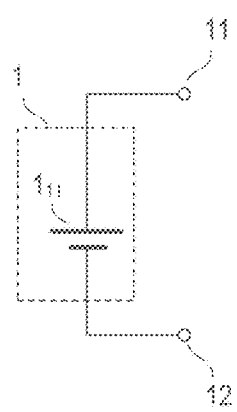
FIGS. 3A-3D illustrate different examples of battery blocks of the type shown in FIG. 1.
Figure 3B:
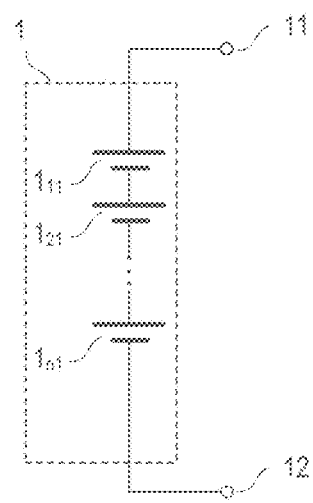
Figure 3C:
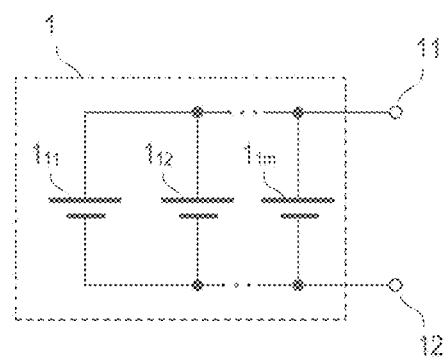
Figure 3D:
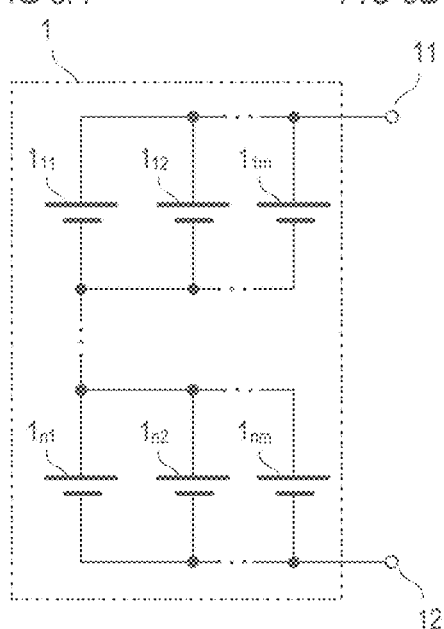

Referring to FIG. 3A, the battery block 1 may include one battery cell $1_{11}$ connected between the first battery block node 11 and the second battery block node 12. According to another example shown in FIG. 3B, the battery block 1 includes a plurality of battery cells $1_{11}$, $1_{21}$, $1_{n1}$ connected in series between the first battery block node 11 and the second battery block node 12. According to another example shown in FIG. 3C, the battery block 1 includes a plurality of battery cells $1_{11}$, $1_{12}$, $1_{1m}$ connected in parallel between the first battery block node 11 and the second battery block node 12. According to yet another example shown in FIG. 3D, the battery block 1 includes a series circuit with two or more parallel circuits, wherein each of these parallel circuits includes two or more battery cells $1_{11}$, $1_{12}$, $1_{1m}$, $1_{n1}$, $1_{n2}$, $1_{nm}$.

According to one example, the measurement values $M_1$-$M_N$ obtained by the monitoring circuits $2_1$-$2_N$ represent a complex impedance of the associated battery block $1_1$-$1_N$. According to one example, measuring the complex impedance of one of the battery blocks $1_1$-$1_N$ includes driving a periodic alternating current into the respective battery block. This is explained in detail herein further below.

The complex impedance of each battery block $1_1$-$1_N$ is dependent on a frequency of the alternating current driven into the respective battery block $1_1$-$1_N$. According to one example, the frequency of this alternating current is defined by the measurement frequency information $FM_1$-$FM_N$ received by the monitoring circuits $2_1$-$2_N$ from the host controller 31. By this, each of the monitoring circuits $2_1$-$2_N$ measures the impedance of the associated battery block $1_1$-$1_N$ at the frequency defined by the host controller 31. Using the frequency synchronization signals, $FSYNC_1$-$FSYNC_N$ signal generators in the monitoring circuits $2_1$-$2_N$ are calibrated such that the monitoring circuits $2_1$-$2_N$ can precisely measure at the frequencies defined by the measurement frequency information $FM_1$-$FM_N$ received from the host controller 31, even if precise oscillators are not implemented in the individual monitoring circuits $2_1$-$2_N$. In other words, in the battery monitoring system shown in FIG. 1, it is sufficient for the host controller 31 to have a relatively precise oscillator that is used to generate the frequency synchronization signals $FSYNC_1$-$FSYNC_N$, which are used to calibrate the monitoring circuits $2_1$-$2_N$, while less precise, and therefore cheaper, oscillators may be implemented in the monitoring circuits $2_1$-$2_N$. "Less precise" in this context means that the frequency of a clock signal generated by these oscillators (a) may deviate from a nominal frequency by a certain amount such as, for example, +/−1%, and (b) may vary dependent on external parameters such as the temperature.

Figure 4:
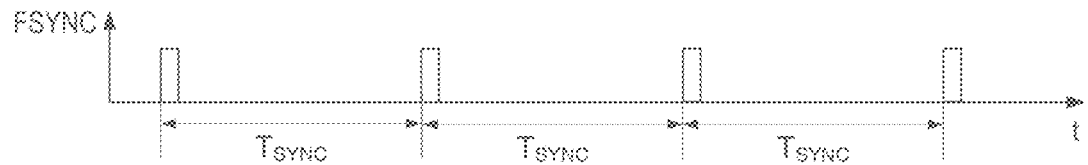
FIGS. 4 and 5 illustrate different examples of a frequency synchronization signal that may be used in a battery monitoring system of the type shown in FIG. 1.
Figure 5:
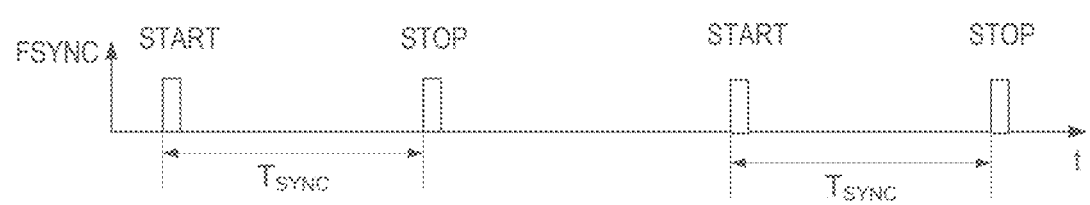

Each of the frequency synchronization signals $FSYNC_1$-$FSYNC_N$ includes at least one pair of time marks, wherein a time period between the at least one pair of time marks is used for calibration purposes in the monitoring circuits $2_1$-$2_N$. Two examples of these frequency synchronization signals $FSYNC_1$-$FSYNC_N$ are illustrated in FIGS. 4 and 5. In each of these figures, FSYNC denotes an arbitrary one of the frequency synchronization signals $FSYNC_1$-$FSYNC_N$.

Referring to FIG. 4, the frequency synchronization signal FSYNC may include a sequence of periodically occurring time marks. "Periodically" in this context means that these time marks occur at a predefined frequency $f_{SYNC}=1/T_{SYNC}$, wherein $T_{SYNC}$ is the duration of a time period between the beginning of two timely successive time marks. In this example, each of two successive time marks form a pair of time marks. According to one example, the duration $T_{SYNC}$ of the time period between two successive time marks represents a calibration information. In the frequency synchronization signal FSYNC of the type shown in FIG. 4, the individual time marks can have the same form. These time marks, for example, may include a data packet with a header addressing one or more of the monitoring circuits $2_1$-$2_N$ and a payload indicating that the data packet is a time mark. The at least one of the monitoring circuits $2_1$-$2_N$ that receives the frequency synchronization signal FSYNC either has information regarding how long the time period $T_{SYNC}$ is or receives this information. This information may be included in the frequency synchronization FSYNC and may be sent periodically or aperiodically to the at least one monitoring circuit. According to one example, the information regarding the duration $T_{SYNC}$ may be included in each data packet representing one time mark. According to one example, the duration $T_{SYNC}$ of the time period represented by the frequency synchronization signal FSYNC is fixed. In this case, the information regarding the duration $T_{SYNC}$ may be stored in the at least one monitoring circuit and does not have to be transmitted as part of the frequency synchronization signal FSYNC.

According to another example shown in FIG. 5, the frequency synchronization signal FSYNC includes at least one pair of time marks, wherein this pair of time mark includes a start mark and a stop mark. A time duration $T_{SYNC}$ between the beginning of the start mark and the beginning of the stop mark represents the calibration information. Pairs of time marks of the type shown in FIG. 5 may occur periodically or aperiodically in the frequency synchronization signal FSYNC. Further, the time duration $T_{SYNC}$ between the start mark and the stop mark of each of several pairs can be identical or can be different. According to one example, the information regarding the duration $T_{SYNC}$ between a start mark and a stop mark is included either in the data packet representing the start mark or the data packet representing the stop mark of each pair of time marks. When the duration $T_{SYNC}$ is fixed and the information regarding the duration $T_{SYNC}$ is stored in the monitoring circuit, the start mark and the stop mark only include an identifier identifying them as start and stop mark but not necessarily the information regarding the duration $T_{SYNC}$.

Figure 6:
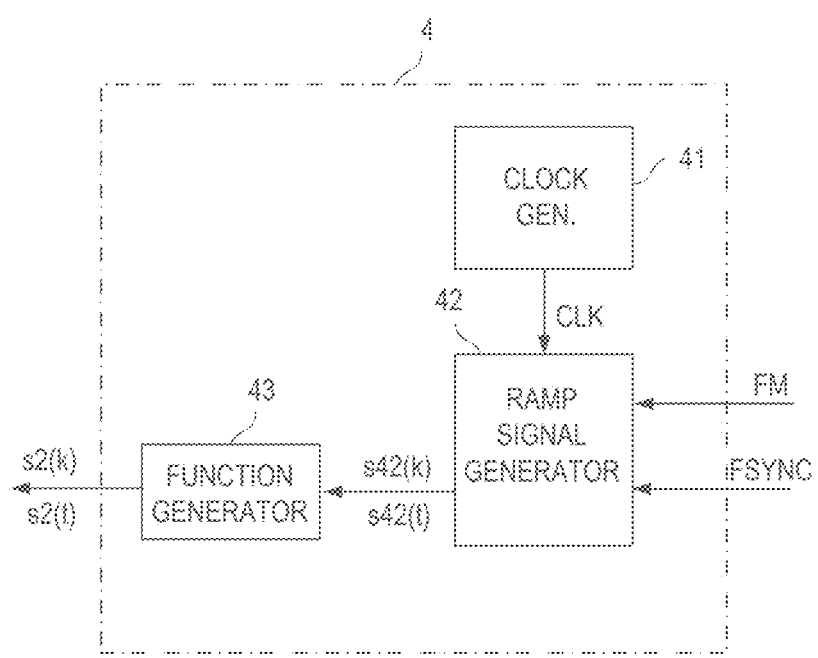
FIG. 6 illustrates one example of a signal generator that may be implemented in a monitoring circuit.
Figure 8:
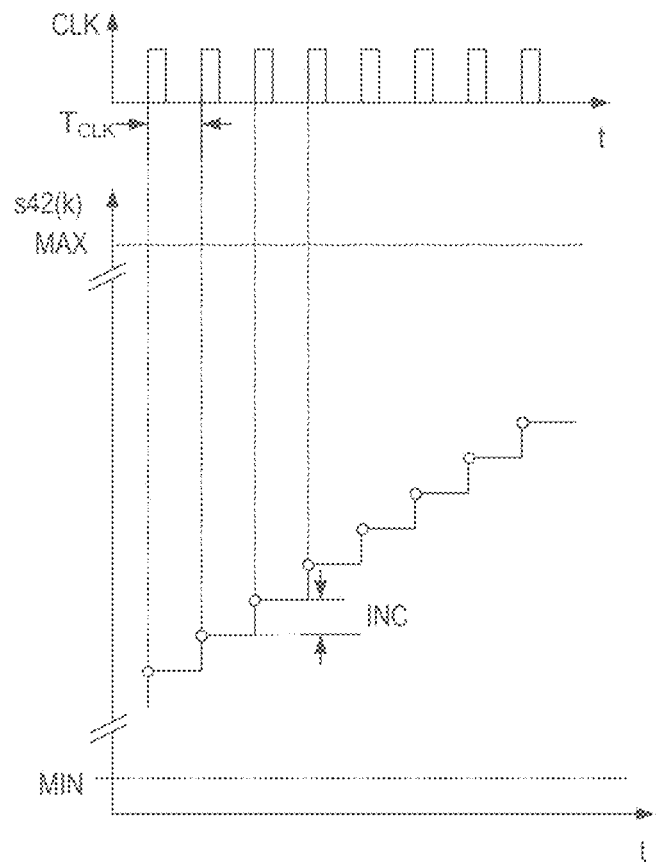
FIG. 8 illustrates generating the ramp signal by the signal generator in greater detail.

FIG. 6 illustrates one example of a signal generator 4 that is configured to generate a periodic signal that may be used in a measurement cycle as explained with reference to FIG. 2. It should be noted that the block diagram shown in FIG. 8 represents the function of the signal generator rather than the specific implementation. The signal generator 4 may be implemented using dedicated circuitry. According to another example, the signal generator 4 includes a microcontroller and software that runs on the microcontroller A signal generator 4 of the type shown in FIG. 6 may be implemented in an arbitrary one of the monitoring circuits $2_1$-$2_N$ shown in FIG. 1. In FIG. 6, reference character FM represents the frequency information and FSYNC represents the frequency synchronization signal received by the monitoring circuit in which the signal generator 4 is implemented.

Referring to FIG. 6, the signal generator 4 includes a clock generator 41 configured to output a clock signal CLK, a ramp signal generator 42, and a function generator 43. The ramp signal generator 42 receives the clock signal CLK, the frequency synchronization signal FSYNC and the frequency information FM. The ramp signal generator 42 is configured to calibrate itself using the frequency synchronization signal FSYNC and output a ramp signal s42(k) based on the clock signal CLK and the frequency information FM. The function generator receives the ramp signal s42(k) and generates the periodic signal s2(k) based on the ramp signal s42(k). The ramp signal and the periodic signal can be continuous-time signals, which are referred to as s42(t) and s2(t) in the following, or discrete-time signals, which are referred to as s42(k) and s2(k) in the following.

Figure 7:
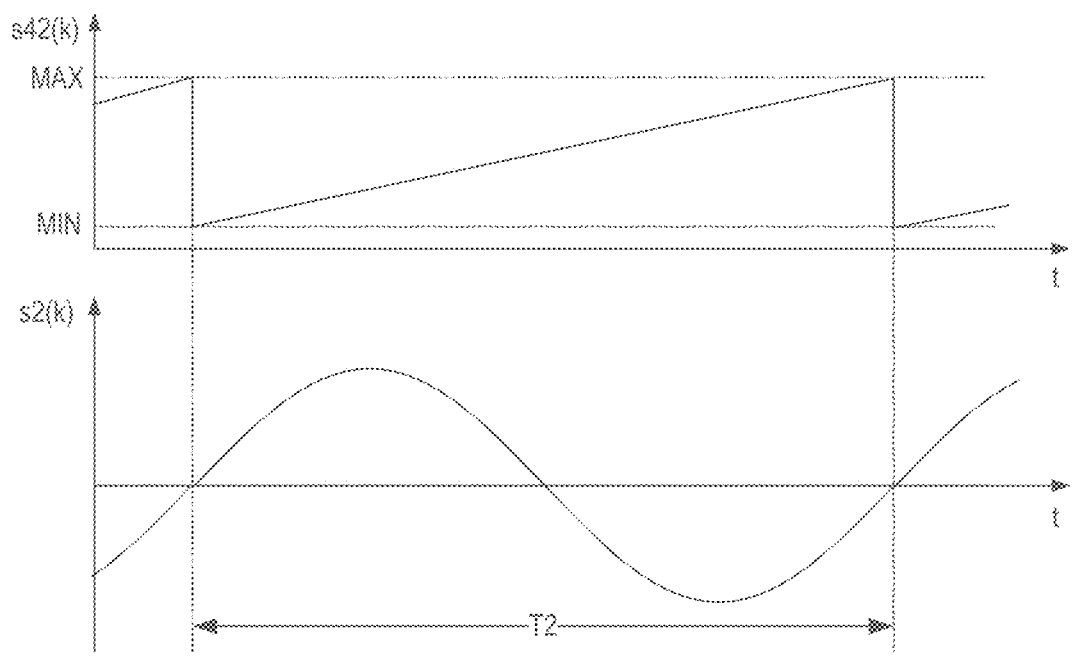
FIG. 7 shows signal waveforms of a ramp signal and a sinusoidal signal that illustrate one example of how the signal generator shown in FIG. 6 may operate.

FIG. 7 shows signal waveforms that illustrate the function of one example of a signal generator of the type shown in FIG. 6. More specifically, FIG. 7 shows signal waveforms of the ramp signal s42(k) generated by the ramp signal generator 42, and one example of a periodic signal s2(k) generated by the function generator 43 based on the ramp signal s42(k). Just for the purpose of illustration, the periodic signal s2(k) is a sinusoidal signal in this example. Further, just for the purpose of explanation it is assumed that the ramp signal s42(k) and the periodic signal s2(k) are discrete-time signals.

Referring to FIG. 7, the ramp signal generator 42 generates the ramp signal s42(k) such that the ramp signal s42(k) increases from a minimum value to a maximum value within a time period of a duration T2 and then again returns to a minimum value. Just for the purpose of illustration, the ramp signal s42(k) according to FIG. 7 is drawn such that in each period the ramp signal s42(k) starts at the same minimum value MIN and ends at the same maximum value MAX. This, however, is only an example. According to one example explained in detail below, the ramp signal s42(k) increases in steps or increments INC. In this case, the maximum value MAX illustrated in FIG. 7 may be used as a threshold such that the ramp signal s42(k) increases in increments INC until it reaches a maximum MAX* that is equal to or higher than the threshold MAX. This maximum MAX* can be in a range of between MAX and MAX+INC. When the ramp signal s42(k) reaches or crosses the threshold MAX, it returns to a minimum MIN* that is given by MAX*−(MAX−MIN), that is, the ramp signal jumps down by MAX−MIN to the minimum value MIN*, wherein MAX−MIN is the difference between the maximum and the minimum MAX−MIN. According to one example, a height of the jump down to the minimum MIN* from MAX* is not given by MAX−MIN, but by MAX−MIN−INC. This may help to avoid that two identical successive signal values of the periodic signal s2(k) are generated.

In order to obtain a sinusoidal signal as illustrated in FIG. 7, the function generator 43 may generate the periodic signal s2(k) based on the signal values of the ramp signal s42(k) such that $$s2(k) = \sin\left(\frac{s42(k) - \text{MIN}}{\text{MAX} - \text{MIN}} 2\pi\right). \tag{1a}$$

In the example illustrated in FIG. 7, the ramp signal s42(k) is a periodic signal and the periodic signal s2(k) is generated such that it has the same frequency 1/T2 or the same duration T2 of one period as the ramp signal s42(k). This, however, is only an example. According to another example, the duration of one period of the ramp signal s42(k) is an integer multiple of the duration T2 of one period of the periodic signal s2(k). In this case, the function generator 43 may generate the periodic signal s2(k) based on the signal values of the ramp signal s42(k) such that $$s2(k) = \sin\left(\frac{s42(k) - \text{MIN}}{\text{MAX} - \text{MIN}} \cdot k \cdot 2\pi\right), \tag{1b}$$

where a duration of one period of the ramp signal s42(k) is k times the duration T2 of one period of the periodic signal s2(k).

Referring to the above, generating the periodic signal s2(k) as a sinusoidal signal is only an example. According to another example, the function generator 43 is configured to generate the periodic signal as a rectangular signal as follows:

$$s2(k) = \begin{cases} A & \text{if } \text{MIN} \le s42(k) \le \text{MIN} + (\text{MAX} - \text{MIN})/2 \\ -A & \text{if } s42(k) > \text{MIN} + (\text{MAX} - \text{MIN})/2 \end{cases}, \tag{2}$$

where A denotes the amplitude of the periodic rectangular signal.

FIG. 8 shows a short sequence of the ramp signal s42(k) in greater detail. More specifically, FIG. 8 shows the ramp signal s42(k) within a time period that equals several clock cycles of the clock signal CLK (and is shorter than the period T2 of the ramp signal s42(k)). In the example shown in FIG. 8, the ramp signal s42(k) is a staircase signal that is output by the ramp signal generator 42 in accordance with the clock signal CLK, so that a frequency at which the signal values of the ramp signal s42(k) occur is defined by a frequency $f_{CLK}$ of the clock signal CLK. This frequency $f_{CLK}$ is referred to as clock frequency in the following and is the reciprocal of the duration $T_{CLK}$ of one period of the clock signal CLK, so that $f_{CLK} = 1/T_{CLK}$. In each clock cycle of the clock signal CLK, the ramp signal s42(k) increases stepwise. A height of the individual steps is referred to as increment INC or step size in the following.

The ramp signal generator 42 is configured to adjust the increment INC such that the time period T2 in which the ramp signal s42(k) increases from the minimum value MIN to the maximum value MAX is defined by the measurement frequency information FM received by the ramp signal generator 42 and equals the desired duration of one period of the periodic signal s2(k). Thus, the frequency at which the ramp signal generator 42 generates ramps of the ramp signal s42(k) is given by the measurement frequency information FM, and the frequency of the periodic signal s2(k) equals the frequency of the ramp signal s42(k).

Figure 9:
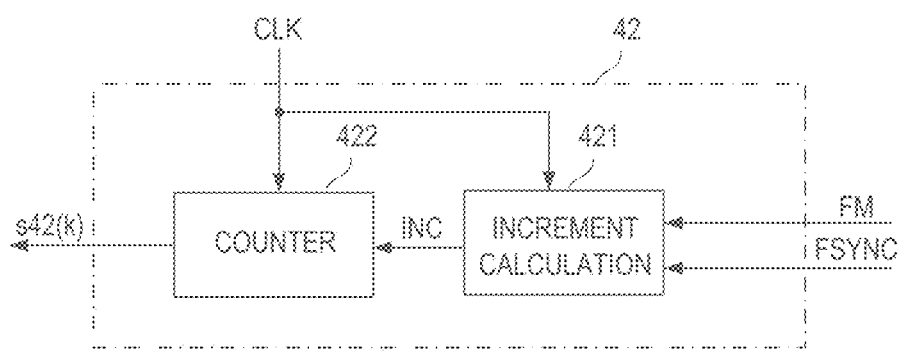
FIG. 9 shows one example of the ramp signal generator.

FIG. 9 shows one example of a ramp signal generator configured to generate a ramp signal s42(k) of the type shown in FIG. 8. In this example, the ramp signal generator 42 includes an increment calculator 421 that receives the frequency synchronization signal FSYNC, the measurement frequency information FM, and the clock signal CLK. A counter 422 receives the increment INC and the clock signal CLK and outputs the ramp signal S42(k). The counter 422 is configured to periodically count from the minimum value MIN* explained above to the maximum value MAX* explained above with an increment given by the increment value INC received from the increment calculator 421. The increment calculator 421 is configured to calculate the increment INC based on the frequency synchronization signal FSYNC, the measurement frequency information FM and the clock signal CLK such that a time period in which the counter 422 counts from the minimum value MIN* to the maximum value MAX* in steps given by the increment and at a frequency given by the clock frequency $f_{CLK}$ essentially equals the duration T2 as defined by the measurement frequency information FM or is a multiple of this duration T2.

Figure 10:
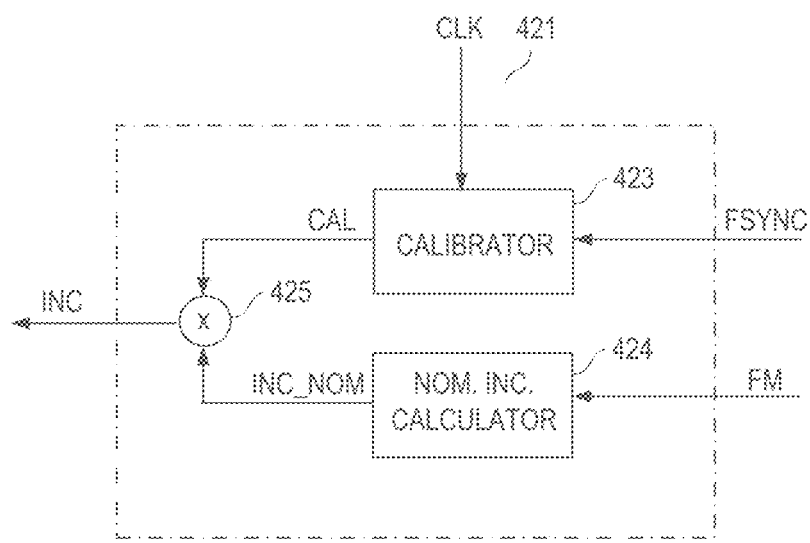
FIG. 10 shows one example of an increment calculator implemented in the ramp signal generator.

One example of the increment calculator 421 is shown in FIG. 10. In this example, the increment calculator 421 includes a calibrator that receives the clock signal CLK and the frequency synchronization signal FSYNC and is configured to calculate a calibration factor CAL. A nominal increment calculator 424 receives the measurement frequency information FM and calculates a nominal increment INC_NOM. Further, a multiplier 425 receives the calibration factor CAL and the nominal increment INC_NOM and calculates the increment INC by multiplying the calibration factor CAL and the nominal increment INC_NOM. It should be noted that the block diagram shown in FIG. 10 serves to illustrate the function of the increment calculator, rather than a specific implementation. The blocks shown in FIG. 10 may, for example, be implemented as circuit blocks in an integrated circuit or as instruction blocks in a program code that runs on a microcontroller.

The calibrator 423 is configured to calculate the calibration factor CAL such that it represents a ratio between the clock frequency $f_{CLK}$ of the clock signal CLK and a nominal clock frequency $f_{CLK\_NOM}$, wherein the nominal clock frequency $f_{CLK\_NOM}$ is the desired, ideal clock frequency of the clock generator (see 41 in FIG. 6), that is $$CAL = \frac{f_{CLK\_NOM}}{f_{CLK}}. \tag{3}$$

Referring to the above, the frequency synchronization signal $F_{SYNC}$ defines a time period $T_{SYNC}$. According to one example, the calibrator 423 counts a number $N_{CLK}$ of clock cycles of the clock signal CLK occurring within the time period $T_{SYNC}$ as defined by the frequency synchronization signal. Further, the calibrator calculates a nominal number $N_{CLK\_NOM}$ of clock cycles by multiplying the nominal clock frequency $f_{CLK\_NOM}$ with the duration $T_{SYNC}$ of the synchronization time period defined by the frequency synchronization signal FSYNC $$N_{CLK\_NOM} = f_{CLK\_NOM} \cdot T_{SYNC} \quad (4).$$

Referring to the above, the information regarding the duration $T_{SYNC}$ of the synchronization time period is included in at least one of the data packets of the frequency synchronization signal FSYNC, so that the calibrator may obtain this information from the frequency synchronization signal FSYNC. The information regarding the nominal clock frequency $f_{CLK\_NOM}$ may be stored in the calibrator 423 or may be received by the calibrator 423 from the host 31.

The number $N_{CLK}$ that is obtained by the calibrator 423 by counting the number of clock cycles in the synchronization time period $T_{SYNC}$ is essentially given by the time period $T_{SYNC}$ multiplied with the clock frequency $f_{CLK}$ $$N_{CLK} = f_{CLK} \cdot T_{SYNC} \quad (5).$$

Based on equations (3) to (5), it can be shown that the calibration factor CAL can be calculated based on the counted number $N_{CLK}$ and the calculated number $N_{CLK\_NOM}$ of clock cycles as follows:

$$CAL = \frac{f_{CLK\_NOM}}{f_{CLK}} = \frac{f_{CLK\_NOM} \cdot T_{SYNC}}{f_{CLK} \cdot T_{SYNC}} = \frac{f_{CLK\_NOM}}{N_{CLK}}. \quad (6)$$

Thus, according to one example, the calibrator 423 calculates the calibrator factor CAL based on the counted number $N_{CLK}$ and the calculated number $N_{CLK\_NOM}$ of clock cycles in accordance with equation (6).

When, for example, the clock frequency $f_{CLK}$ of the clock generator 41 is higher than the nominal frequency $f_{CLK\_NOM}$ the counted number $N_{CLK}$ is higher than the (expected) nominal number $N_{CLK\_NOM}$ Based on equation (6), this has the effect that calibration factor CAL is smaller than 1 (CAL<1). Equivalently, the calibration factor CAL is greater than 1 (CAL>1) when the clock frequency $f_{CLK}$ of the clock generator 41 is lower than the nominal frequency $f_{CLK\_NOM}$. One example is explained in the following.

For the purpose of explanation, it is assumed that the nominal clock frequency $f_{CLK\_NOM}$ is 10 MHz (megahertz), the clock frequency $f_{CLK}$ is 10.1 MHz (which is 1% higher than the nominal clock frequency), and the synchronization time period $T_{SYNC}$ is 4 milliseconds (ms). In this example, the nominal number $N_{CLK\_NOM}$ is 40000 (10 MHz·4 ms) while the counted number $N_{CLK}$ is 40400, which is 1% higher than the nominal number. The calibration factor CAL is given by $1/1.01 \approx 0.99$ in this example.

According to one example, the nominal increment calculator 424 calculates the nominal increment based on the measurement frequency f2 represented by the measurement frequency information FM and the nominal clock frequency $f_{CLK\_NOM}$ information FM as follows:

$$INC\_NOM = \frac{f2}{f_{CLK\_NOM}} \cdot (MAX - MIN). \quad (7)$$

The nominal increment INC_NOM is the increment that causes the counter 422 of the ramp signal generator to count from the minimum value MIN to the maximum value MAX within one period T2 (=1/f2) as defined by the measurement frequency information FM if the clock frequency $f_{CLK}$ equals the nominal clock frequency $f_{CLK\_NOM}$. Deviations of the clock frequency $f_{CLK}$ from the nominal clock frequency $f_{CLK\_NOM}$ are taken into account by calculating the increment INC received by the counter 422 based on multiplying the nominal increment INC_NOM with the calibration factor CAL by the multiplier 425, so that:

$$INC = CAL \cdot INC\_NOM \quad (8).$$

Based on equations (3) and (8) it can be seen that the increment INC is smaller than the nominal increment INC_NOM when the clock frequency $f_{CLK}$ is greater than the nominal clock frequency $f_{CLK\_NOM}$ and greater than the nominal increment INC_NOM when the clock frequency $f_{CLK}$ is smaller than the nominal clock frequency $f_{CLK\_NOM}$.

Figure 11A:
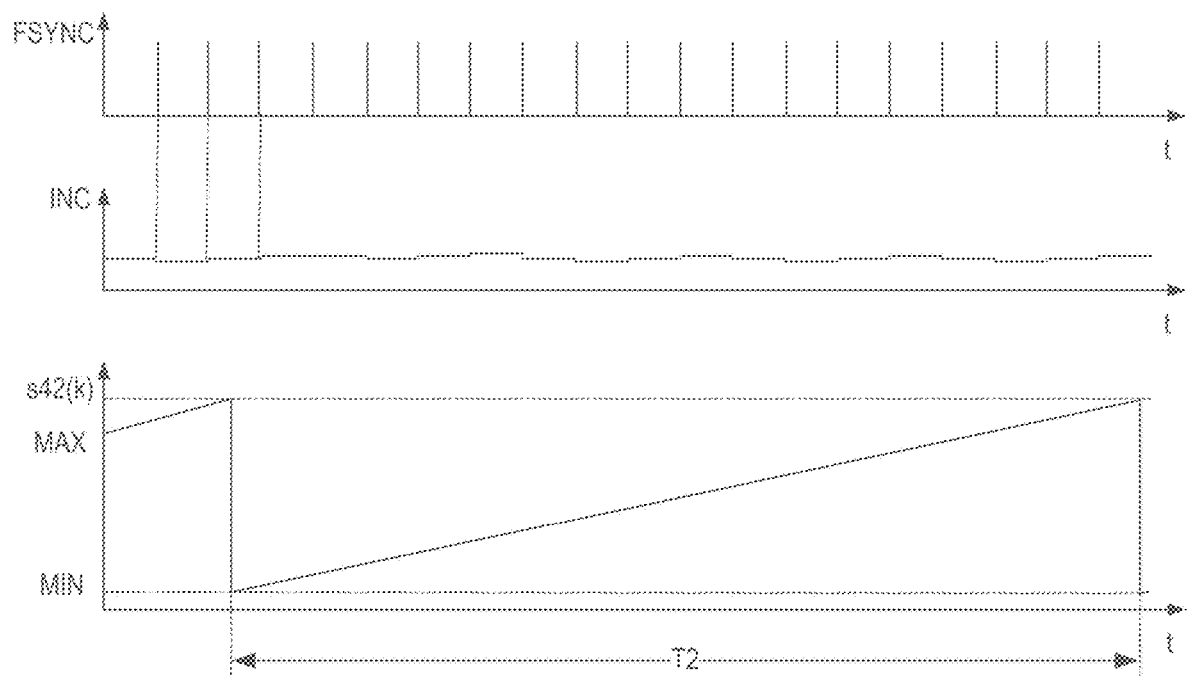
FIGS. 11A and 11B show signal waveforms that illustrate the function of the increment calculator shown in FIG. 10.
Figure 11B:
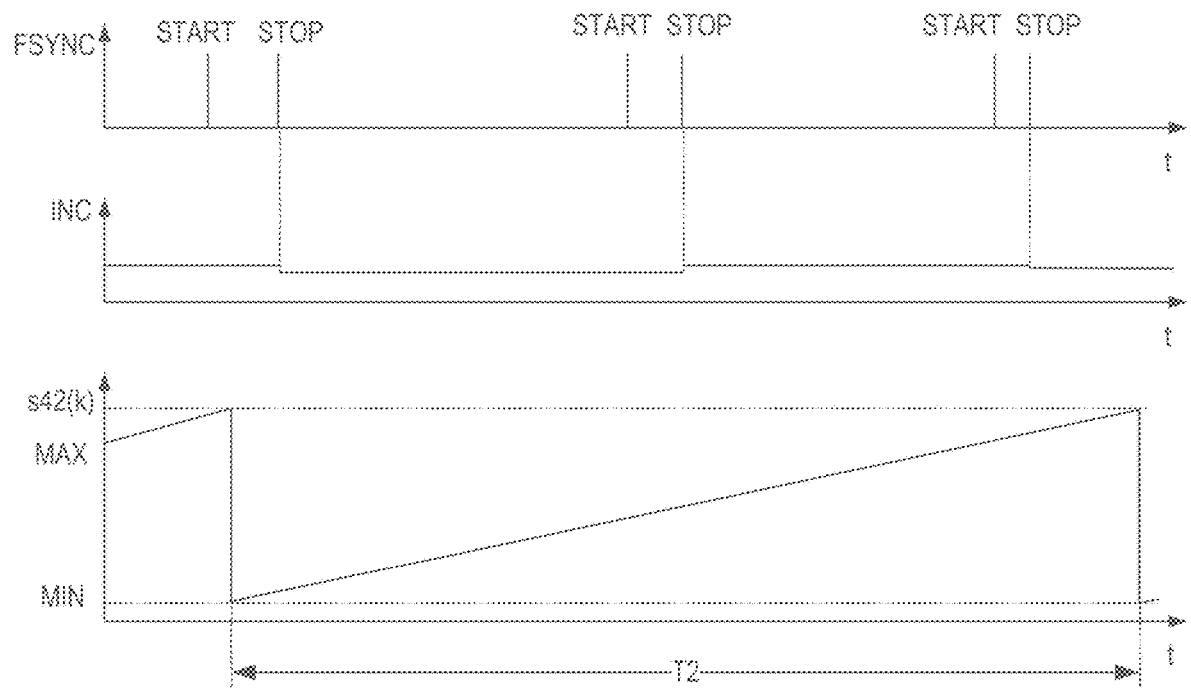

Referring to the above, the clock frequency $f_{CLK}$ of the clock generator 41 included in the signal generator 4 in each monitoring circuit $2_1$-$2_N$ may vary over the time because, for example, the temperature of the monitoring circuits $2_1$-$2_N$ changes. Thus, according to one example, the frequency synchronization signal FSYNC includes time marks periodically or aperiodically throughout the measurement process and the increment generator 421 is configured to calculate and update the increment INC at the end of each pair of time marks it receives. This is schematically illustrated in FIGS. 11A and 11B. Each of FIGS. 11A and 11B shows examples of signal waveforms of the frequency synchronization signal FSYNC, the increment INC, and the ramp signal s42(k), wherein FIG. 11A illustrates a periodic frequency synchronization signal FSYNC in accordance with FIG. 4 and FIG. 11B illustrates an aperiodic frequency synchronization signal FSYNC in accordance with FIG. 5. In each of these cases, several pairs of time marks are received by the increment generator 421 within one period T2 of the ramp signal s42(k) so that the increment is calculated and updated at the end of each pair of time marks. In FIGS. 11A and 11B, just for the purpose of illustration, it is assumed that the clock frequency $f_{CLK}$ varies steadily so that the increment INC (slightly) changes at the end of each pair of time marks.

Figure 12:
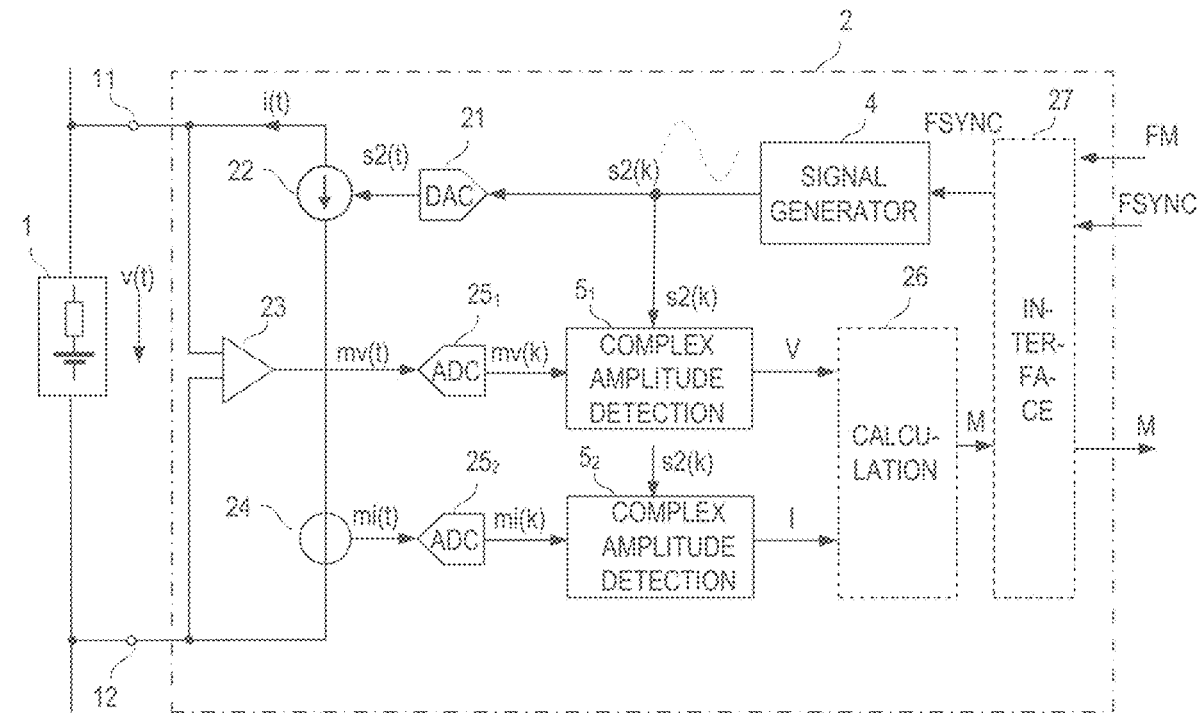
FIG. 12 illustrates one example of a monitoring circuit.

FIG. 12 illustrates one example of a monitoring circuit. In FIG. 12, reference number 2 denotes an arbitrary one of the monitoring circuits $2_1$-$2_N$ shown in FIG. 1, and reference number 1 denotes the battery block associated with the monitoring circuit 2. Referring to FIG. 12, the monitoring circuit 2 includes the signal generator 4 configured to generate the periodic signal s2(k) based on the measurement frequency information FM and the frequency synchronization signal FSYNC. The signal generator 4 may directly receive the measurement frequency information FM and the frequency synchronization signal FSYNC. According to another example (illustrated in dashed lines in FIG. 12) the monitoring circuit 2 includes an interface circuit 27 coupled to the communication channel 32. This interface circuit 27 is configured to retrieve information or signals dedicated to the monitoring circuit 2 from the communication channel 32 (not shown in FIG. 12) and forwards this information or these signals to circuit blocks in the monitoring circuit 2. Further, the interface circuit 27 is configured to receive information or signals from circuit blocks inside the monitoring circuit 2 and to transmit this information or these signals via the communication channel 32. FIG. 12 shows a block diagram of the monitoring circuit 2. It should be noted that this block diagram represents the function of the monitoring circuit 2 rather than the specific implementation. The monitoring circuit 2 may be implemented using dedicated circuitry. According to another example, the monitoring circuit 2 includes a microcontroller and software that runs on the microcontroller.

Just for the purpose of illustration, it is assumed that the signal generator 4 generates a discrete-time periodic signal s2(k) with a frequency f2 that is dependent on the measurement frequency information FM. According to another example (not shown), the signal generator 4 generates a continuous-time signal.

Referring to FIG. 12, a current source 22 is connected between the battery block nodes 11, 12 and is configured to generate a periodic current i(t) based on the periodic signal s2(k). More specifically, the periodic current i(t) has a signal waveform and a frequency as defined by the periodic signal s2(k). According to one example, the current source 22 is a variable current source that receives the periodic signal s2(k) as an input signal and generates the current i(t) based on the periodic signal s2(k). According to one example, the current source 22 is configured to receive a continuous-time input signal. In this case, a digital-to-analog converter (DAC) 21 converts the discrete-time periodic signal s2(k) into the continuous-time input signal received by the current source 22. According to another example, the current source 22 is configured to receive the discrete-time periodic signal s2(k). In this example, the DAC 21 can be omitted.

Referring to FIG. 12, the monitoring circuit 2 further includes a voltage measurement circuit 23 configured to measure a voltage v(t) between the first and second battery block nodes 11, 12 and provide a voltage measurement signal mv(t) that is dependent on the voltage v(t). According to one example, the voltage measurement signal mv(t) is proportional to the voltage v(t). Further, a current detection circuit 24 measures the current i(t) provided by the current source 22 to the battery block 1 and provides a current measurement signal mi(t) that is dependent on the current i(t). According to one example, the current measurement signal mi(t) is proportional to the current i(t).

The monitoring circuit 2 further includes a first amplitude detector $5_1$ that is configured to detect or determine a complex amplitude of the voltage v(t) based on the voltage measurement signal mv(t) and the periodic signal s2(k), and a second amplitude detector $5_2$ that is configured to detect or determine a complex amplitude of the current i(t) based on the current measurement signal mi(t) and the periodic signal s2(k). In the example shown in FIG. 12, the first and second amplitude detectors $5_1$, $5_2$ are configured to process discrete-time signals. In this case, a first analog-to-digital converter (ADC) $25_1$ generates a discrete-time representation mv(k) of the voltage measurement signal mv(t) and the first amplitude detector $5_1$ receives this discrete-time representation mv(k), which will also be referred to as discrete-time voltage measurement signal in the following. Further, a second ADC $25_2$ generates a discrete-time representation mi(k) of the current measurement signal mi(t) and the second amplitude detector $5_2$ receives this discrete-time representation mi(k), which will also be referred to as discrete-time current measurement signal in the following.

The first amplitude detector $5_1$ outputs a measurement value that represents a complex amplitude V of the voltage v(t), and the second amplitude detector $5_2$ outputs a measurement value that represents a complex amplitude of the current i(t). According to one example, a calculation circuit 26 calculates a complex amplitude of an impedance of the battery block 1 based on the complex amplitude of the voltage V and the complex amplitude of the current I, and the monitoring circuit 2 transmits the complex amplitude of the impedance to the host controller. According to another example, the monitoring circuit 2 transmits both the complex amplitude of the voltage V and the complex amplitude of the current I to the host controller, and the host controller 31 calculates the complex impedance based on these complex amplitudes I, V.

The function of the monitoring circuit 2 is explained in further detail in the following. Just for the purpose of explanation it is assumed that the periodic signal s2(k) generated by the monitoring circuit 2 is a sinusoidal signal, so that the current i(t) provided by the current source 22 is a sinusoidal current given by $$i(t)=I_{DC}+I_0 \cdot \sin(2\pi(f2)t) \quad (9).$$

In equation (9), $I_{DC}$ denotes an optional direct current (DC) offset of the current. This offset may be generated by the current source 22 independent of the input signal s2(t). $I_o$ is an amplitude of a sinusoidal current component of the current i(t). This sinusoidal current component is defined by the periodic signal s2(k), that is, a frequency and a phase of the sinusoidal current component are defined by the periodic signal s2(k). Further, in equation (1), ω=2π·f2, with f2 being the frequency represented by the measurement frequency information FM.

As used herein, "driving the current i(t) into the battery block 1" may include driving only a positive current that charges the battery block 1, driving only a negative current that discharges the battery block 1, or alternatingly driving a positive current and a negative current. If in the example given in equation (5) the DC offset $I_{DC}$ is zero ($I_{DC}$=0), there are time periods when the current is positive so that the battery 1 is charged and time periods when the current is negative so that the battery is discharged, wherein over each period of the sinusoidal input current i(t) the charging state of the battery block 1 does not change. According to another example, the DC offset $I_{DC}$ is different from zero and selected such that the input current is either only positive or only negative, wherein the current direction of the input current i(t) can be adjusted by selecting the sign (positive or negative) of the DC offset $I_{DC}$.

Generating the periodic signal s2(k) as a sinusoidal signal so that the alternating current i(t) has a sinusoidal current component is only an example. A periodic signal s2(k) that has a waveform different from a sinusoidal waveform may be used as well. Examples of these other types of waveforms include, but are not restricted to, a rectangular waveform, a triangular waveform, a sine square waveform, or the like.

When the input current i(t) is, for example, a sinusoidal current as given by equation (9) the voltage v(t) between the battery nodes 11, 12 is an alternating voltage as follows:

$$v(t)=V_0+R1 \cdot I_{DC}+Z_0 \cdot I_0 \cdot \sin(2\pi(f2)t+\varphi 1)) \quad (10),$$

where $Z_0$ is the magnitude of a complex impedance Z of the battery block 1, φ1 is a phase shift introduced by the complex impedance of the battery, and R1 represents the resistance associated with the direct component $I_{DC}$ of the current i(t). Further, $V_o$ is an optional offset of the battery voltage v(t). This offset $V_o$ represents a charging state of the battery block 1, that is, $V_o$ is the voltage that can be measured between the battery nodes 11, 12 when no input current (i(t)=0) is driven into the battery 1.

The complex impedance Z of the battery block is given by $$Z=Z_o \cdot e^{j\varphi 1} \quad (11),$$

where $Z_o$ denotes the magnitude and φ1 denotes the phase. The complex impedance Z is dependent on the frequency f2 of the current i(t). Thus, by measuring the complex impedance Z at different frequencies f2 of the current i(t) a state of health of the battery, the temperature, or the like may be detected. According to one example, the host controller 31 is configured to send different measurement frequency information FM representing different measurement frequencies f2 to the individual monitoring circuits $2_1$-$2_N$ over the time so that the individual monitoring circuits $2_1$-$2_N$ measure the associated battery block $1_1$-$1_N$ at different frequencies and enable the host controller to detect a state of health of the battery blocks $1_1$-$1_N$.

Figure 13:
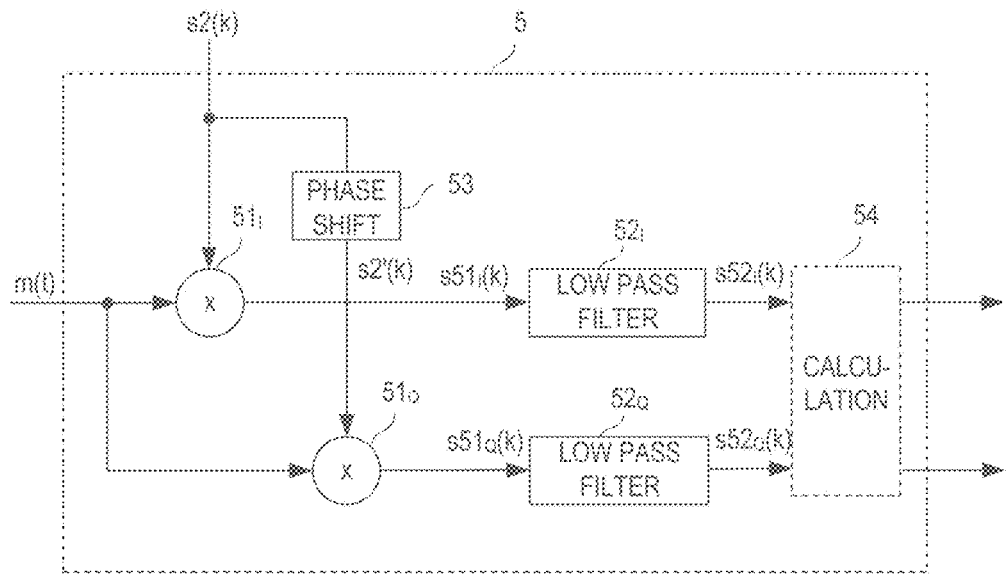
FIG. 13 shows one example of a complex amplitude detection circuit implemented in the monitoring circuit shown in FIG. 12.

One example of how the amplitude detectors $5_1$, $5_2$ may be implemented is illustrated in FIG. 13. In FIG. 13, reference number 5 denotes an arbitrary one of the amplitude detectors $5_1$, $5_2$ shown in FIG. 12, m(k) denotes the measurement signal received by the amplitude detector 5. Referring to FIG. 13, the amplitude detector 5 includes a first multiplier $51_1$ that receives the measurement signal m(k) and the periodic signal s2(k) and multiplies these signals, so that an output signal $s51_1(k)$ of the first multiplier $51_1$ is given by a product of the measurement signal m(k) and the periodic signal s2(k). A second multiplier $51_Q$ multiplies the measurement signal m(k) with a further periodic signal s2'(k). This further periodic signal s2'(k) is generated by a phase shifter 53 based on the periodic signal s2(k) and has a phase shift of 90° (=φ/2) relative to the periodic signal s2(k). An output signal $s51_Q(k)$ of the second multiplier $51_Q$ is given by a product of the measurement signal m(k) and the further periodic signal s2'(k). Alternatively, the signal generator 4 not only generates the periodic signal s2(k), but also generates the further periodic signal s2'(k). In this case, the phase shifter 53 can be omitted.

In the first amplitude detector $5_1$, which receives the discrete-time voltage measurement signal mv(k), output signals $s51_1(k)$ and $s51_Q(k)$ of the first and second multiplier $51_1$, $51_Q$ are given by equations (12a) and (12b) below. Just for the purpose of illustration, these equations are based on the assumption that the voltage v(t) is given by equation (10).

$$s51_I(k) = mv(k) \cdot s2(k) = \left[V_0 + R1 \cdot I_{DC} + Z_0 \cdot I_0 \cdot \sin\left(2\pi\frac{f2}{fs}k + \varphi1\right)\right] \cdot \sin\left(2\pi\frac{f2}{fs}k\right) \quad (12a)$$

$$s51_Q(k) = mv(k) \cdot s2'(k) = \left[V_0 + R1 \cdot I_{DC} + Z_0 \cdot I_0 \cdot \sin\left(2\pi\frac{f2}{fs}k + \varphi1\right)\right] \cdot \cos\left(2\pi\frac{f2}{fs}k\right). \quad (12b)$$

In equations (12a) and (12b), fs denotes the frequency at which the first ADC $25_1$ samples the voltage measurement signal mv(t) and the frequency at which signal values of the periodic signal s2(k) and the further periodic signal s2'(k) occur. For the purpose of illustration, it is assumed in equations (8a) and (8b) that the periodic signal s2(k) is a sinusoidal signal.

Referring to FIG. 13, the amplitude detector 5 further includes a first low pass filter $52_1$ that receives the output signal $s51_1(k)$ of the first multiplier $51_1$ and a second low pass filter $52_Q$ that receives the output signal $S51_Q(k)$ of the second multiplier $51_Q$. Each of the first and second low pass filters $52_1$, $52_Q$ has a corner frequency lower than the frequency of the periodic signal s2(k), so that signal components with a frequency equal to the frequency of the periodic signal s2(k) or higher are filtered out. Using trigonometric functions and the characteristics of a low pass filter with a corner frequency lower than f it can be shown that filter input signals $S51_1(k)$, $S51_Q(k)$ of the type given in equations (5a) and (5b) result in filter output signals $S52_1(k)$, $S52_Q(k)$ as follows:

$$s52_I(k) = Z_0 \cdot I_0 \cdot \cos(\varphi 1) \quad (13a)$$

$$s52_Q(k) = Z_0 \cdot I_0 \cdot \sin(\varphi 1) \quad (13b).$$

The output signal $S52_1(k)$ of the first low pass filter $52_1$ is the in phase component of the complex amplitude of the voltage V across the battery block 1, and the output signal $S52_Q(k)$ of the second load path filter 52Q is the quadrature component of the complex amplitude of the voltage V. The magnitude $V_o = Z_o \cdot I_o$ and the phase φ1 can be obtained from the filter output signals $S52_1(k)$, $S52_Q(k)$ as follows:

$$V_0 = \sqrt{(s52_I(k))^2 + (s52_Q(k))^2} \quad (14a)$$

$$\varphi 1 = \arctan\left(\frac{s52_Q(k)}{s52_I(k)}\right). \quad (14b)$$

Equations (13a), (13b) and (14a), (14b) are different representations of the complex amplitude V of the voltage across the battery block obtained by the first amplitude detector $5_1$. The first amplitude detector $5_1$ may output the output signal $s52_1(k)$, $s52_Q(k)$ of the low pass filters $52_1$, $52_Q$. Optionally, a calculation circuit 54 may calculate the magnitude $Z_o$ and the phase φ1 as given by equations (14a) and (14b) and output these parameters.

The second amplitude detector $5_2$ obtains the complex amplitude of the current i(t). For the purpose of illustration it is assumed that the current i(t) is in phase with the periodic signal s2(k) so that the complex amplitude I of the current is given by $I = I_o \cdot e^{jo} = I_o$, where $I_o$ is the magnitude. In this case, the magnitude $Z_o$ of the complex impedance Z is given by $$Z_0 = \frac{V_0}{I_0}, \quad (15)$$

and the phase is given by equation (14b). If the current source 22 introduces a phase shift 92 so that the complex amplitude of the current i(t) is given by $I = I_o \cdot e^{j\varphi 2}$ the phase of the complex impedance is given by the difference φ1-φ2.

Referring to the above, the calculation circuit 26 shown in FIG. 12 may calculate the complex impedance Z based on the complex amplitudes V, I of the voltage and the current output by the first and second amplitude detector $5_1$, $5_2$ and output a signal representing the complex amplitude Z of the impedance to the host controller 31. According to another example, the calculation circuit 26 is omitted and signals representing the complex amplitudes V, I of the voltage and the current are transmitted to the host controller 31.

In the monitoring system shown in FIG. 1, each of the monitoring circuits $2_1$-$2_N$ drives an alternating measurement current into the respective battery block $1_1$-$1_N$. The measurement current has a frequency defined by the measurement information $FM_1$-$FM_N$ received by the respective monitoring circuit $2_1$-$2_N$. The measurement frequency information represented by the measurement information $FM_1$-$FM_N$ received by the monitoring circuits at one time may be identical so that the monitoring circuits $2_1$-$2_N$, at one time, measure the voltages and the currents of the battery blocks $1_1$-$1_N$ at the same frequencies. According to another example, the measurement information $FM_1$-$FM_N$ represents at least two different measurement frequencies. The individual monitoring circuits $2_1$-$2_N$ may receive the same frequency synchronization signal. This, however, is only an example. According to another example, the individual monitoring circuits $2_1$-$2_N$ receive different frequency synchronization signals. The voltage and current measurements performed by the individual monitoring circuits $2_1$-$2_N$ may be synchronized, that is, the signal generators in the individual monitoring circuits $2_1$-$2_N$ may generate the internal periodic signals (s2(k) in the examples explained before) synchronously (in phase with each other). The latter, however, is not mandatory.

Figure 14:
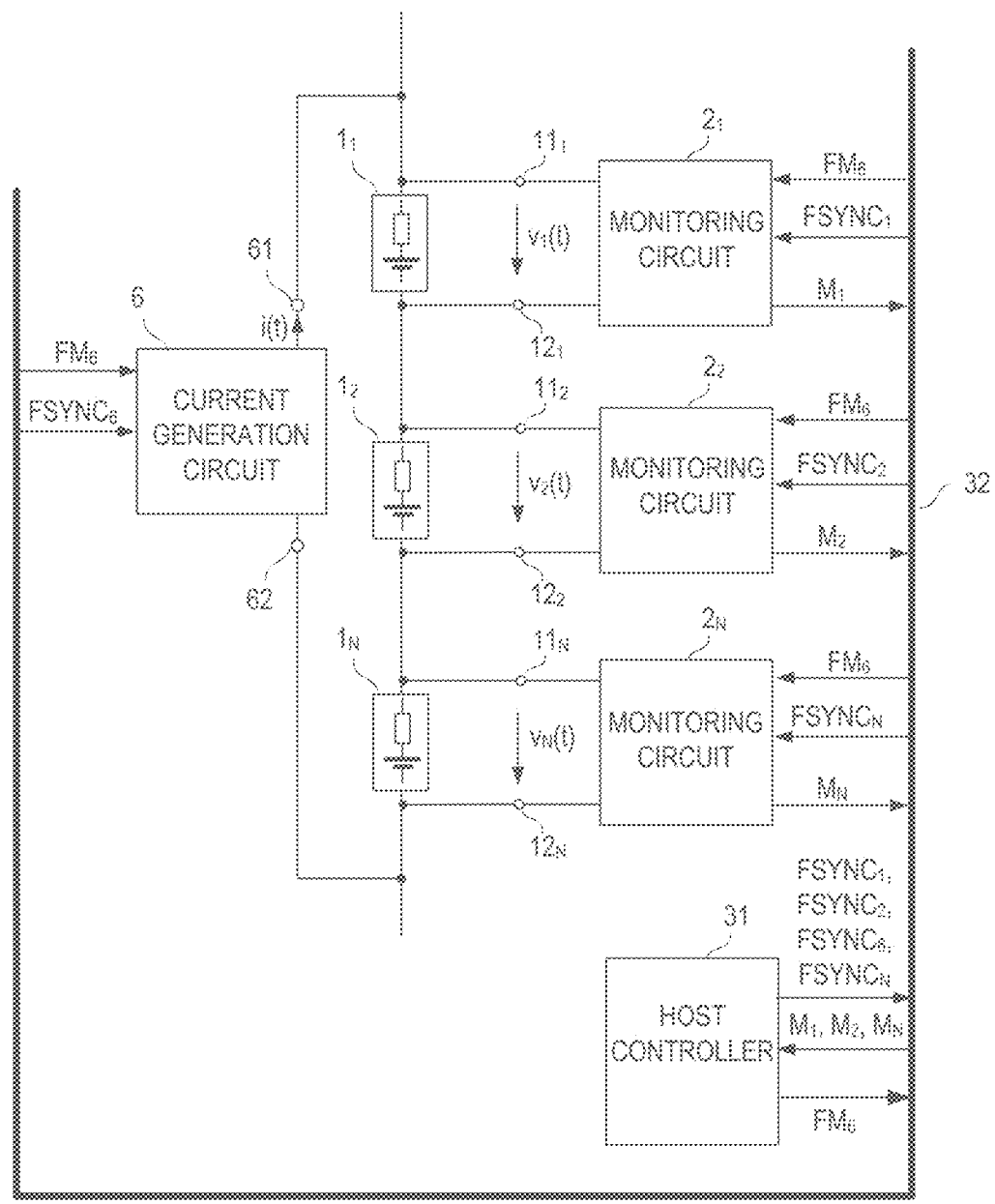
FIG. 14 illustrates one example of a battery monitoring system having a plurality of monitoring circuits and a current source.

FIG. 14 shows a battery monitoring system according to another example. In this example, the monitoring system further includes a current generation circuit 6. The current generation circuit is coupled to the series circuit with the battery blocks $1_1$-$1_N$ and drives an alternating current i(t) into the battery blocks $1_1$-$1_N$ of this series circuit. This alternating current i(t) is also referred to as measurement current in the following. A frequency of this current is defined by measurement frequency information $FM_6$ received by the current source 6 from the host controller. In this monitoring system, the monitoring circuits $2_1$-$2_N$, at the same time, measure at the same frequency so that the monitoring circuits $2_1$-$2_N$ receive the same frequency information $FM_6$ from the host controller 31. Further, each of the monitoring circuits $2_1$-$2_N$ receives a frequency synchronization signal $FSYNC_1$, $FSYNC_2$, $FSYNC_N$ as explained before, and the current generation circuit 6 receives a frequency synchronization signal $FSYNC_6$ from the host controller 31. Everything that has been explained with regard to the frequency synchronization signals $FSYNC_1$, $FSYNC_2$, $FSYNC_N$ illustrated in FIG. 1 applies to the frequency synchronization signals $FSYNC_1$, $FSYNC_2$, $FSYNC_N$ and the frequency synchronization signal $FSYNC_6$ shown in FIG. 14 equivalently. In particular, the frequency synchronization signals $FSYNC_1$, $FSYNC_2$, $FSYNC_N$, $FSYNC_6$ can be identical or can be different.

In the monitoring system shown in FIG. 14, each of the monitoring circuits $2_1$-$2_N$ generates the respective periodic measurement signal s2(k) at the same frequency as the measurement current i(t) generated by the current source. This is obtained in that the monitoring circuits $2_1$-$2_N$ and the current source 6 receive the same frequency measurement information $FM_6$, that is, frequency measurement information $FM_6$ that represent the same measurement frequency f2. The frequency measurement information $FM_6$ may be transmitted to the monitoring circuits $2_1$-$2_N$ and the current source 6 at the same time or at different times.

Figure 15:
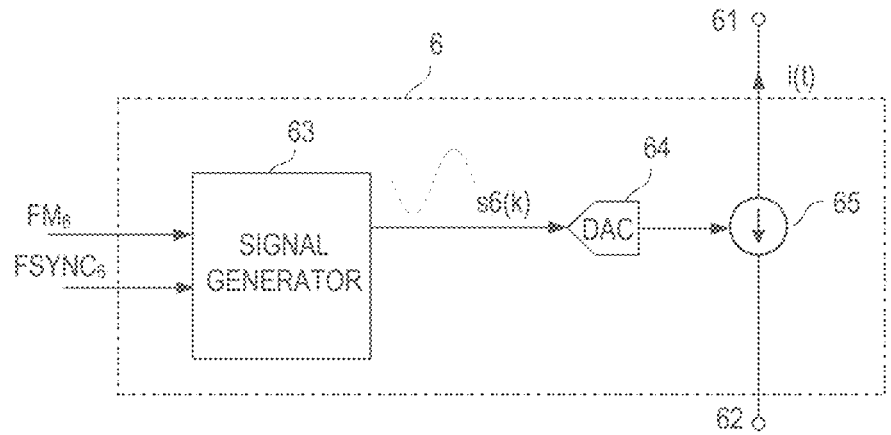
FIG. 15 illustrates one example of a current source that may be used in a battery monitoring system of the type shown in FIG. 14.

One example of the current generation circuit 6 is shown in FIG. 15. This current generation circuit 6 includes a signal generator 63 that receives the synchronization signal $FSYNC_6$ and generates a periodic signal s6(k) with a frequency that is based on the measurement frequency information $FM_6$. A current source 65 receives this periodic signal s6(k) as an input signal and generates the current i(t) based on the periodic signal s6(k). The periodic signal s6(k) may be a discrete-time signal. In this case, a DAC 64 generates a continuous-time signal that is received by the current source 65. The function of the signal generator 63 and the current source 65 can be identical to the function of the signal generator 4 and the current source 22 shown in FIG. 6. In particular, the signal generator 63 may be implemented in the same fashion as the signal generator 4 explained herein before.

Figure 16:
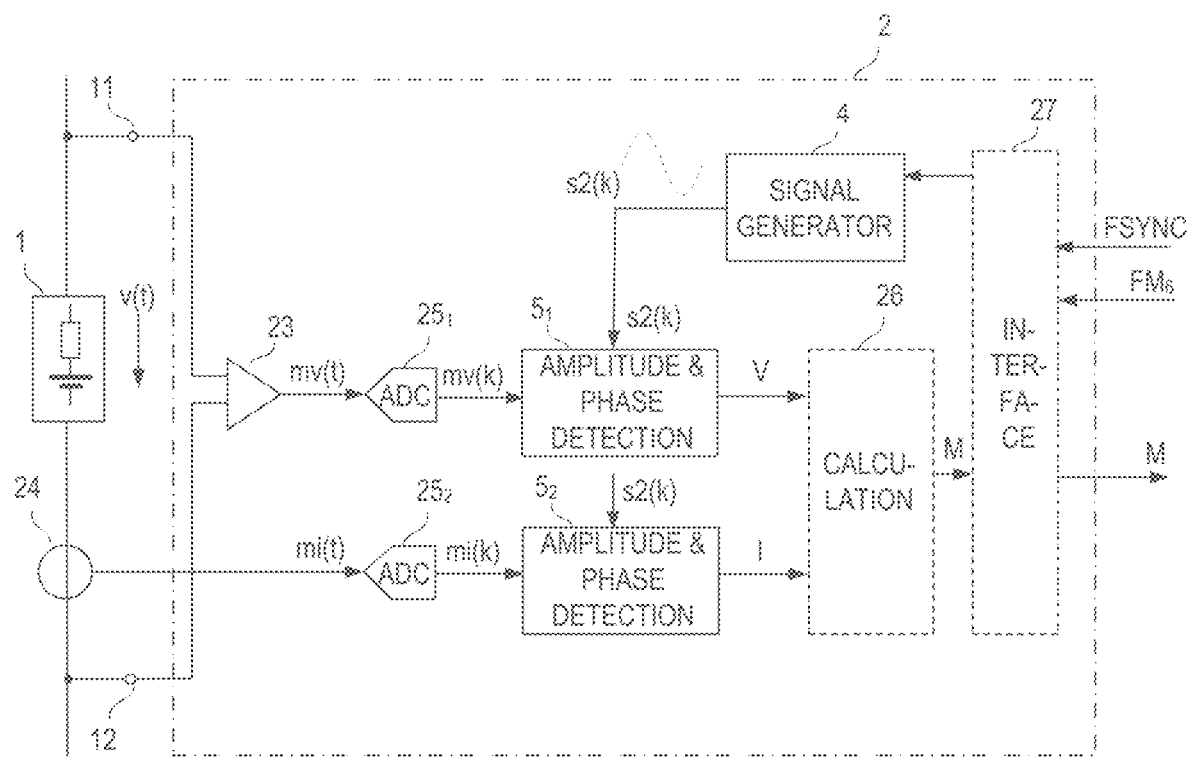
FIG. 16 illustrates one example of a monitoring circuit that may be used in a battery monitoring system of the type shown in FIG. 14.

FIG. 16 shows one example of a monitoring circuit 2 that may be used in the monitoring system shown in FIG. 14. Reference number 2 in FIG. 15 represents an arbitrary one of the monitoring circuits $2_1$-$2_N$ shown in FIG. 14, and reference character FSYNC denotes the frequency synchronization signal received by the monitoring circuit. The monitoring circuit 2 shown in FIG. 16 is based on the monitoring circuit 2 shown in FIG. 12 and is different from the monitoring circuit shown in FIG. 12 in that it does not include the current source 22. In the monitoring system shown in FIG. 14, the current generation circuit 6 (which may also be referred to as current source) takes over the functions of the current sources that are included in the individual monitoring circuits $2_1$-$2_N$ in the system shown in FIG. 1, so that in the system shown in FIG. 14 the current sources in the individual monitoring circuits $2_1$-$2_N$ can be omitted.

As in the monitoring circuit 2 shown in FIG. 12, the monitoring circuit 2 shown in FIG. 16 detects the complex amplitude V of the voltage v(t) across the associated battery block 1 and the complex amplitude I of the current i(t) through the battery block 1. The monitoring circuit 2 may calculate the complex impedance Z or may simply forward both the complex amplitude V of the voltage and the complex amplitude I of the current to the host controller 31. In the latter case, the host controller 31 calculates the complex impedance Z.

Figure 17:
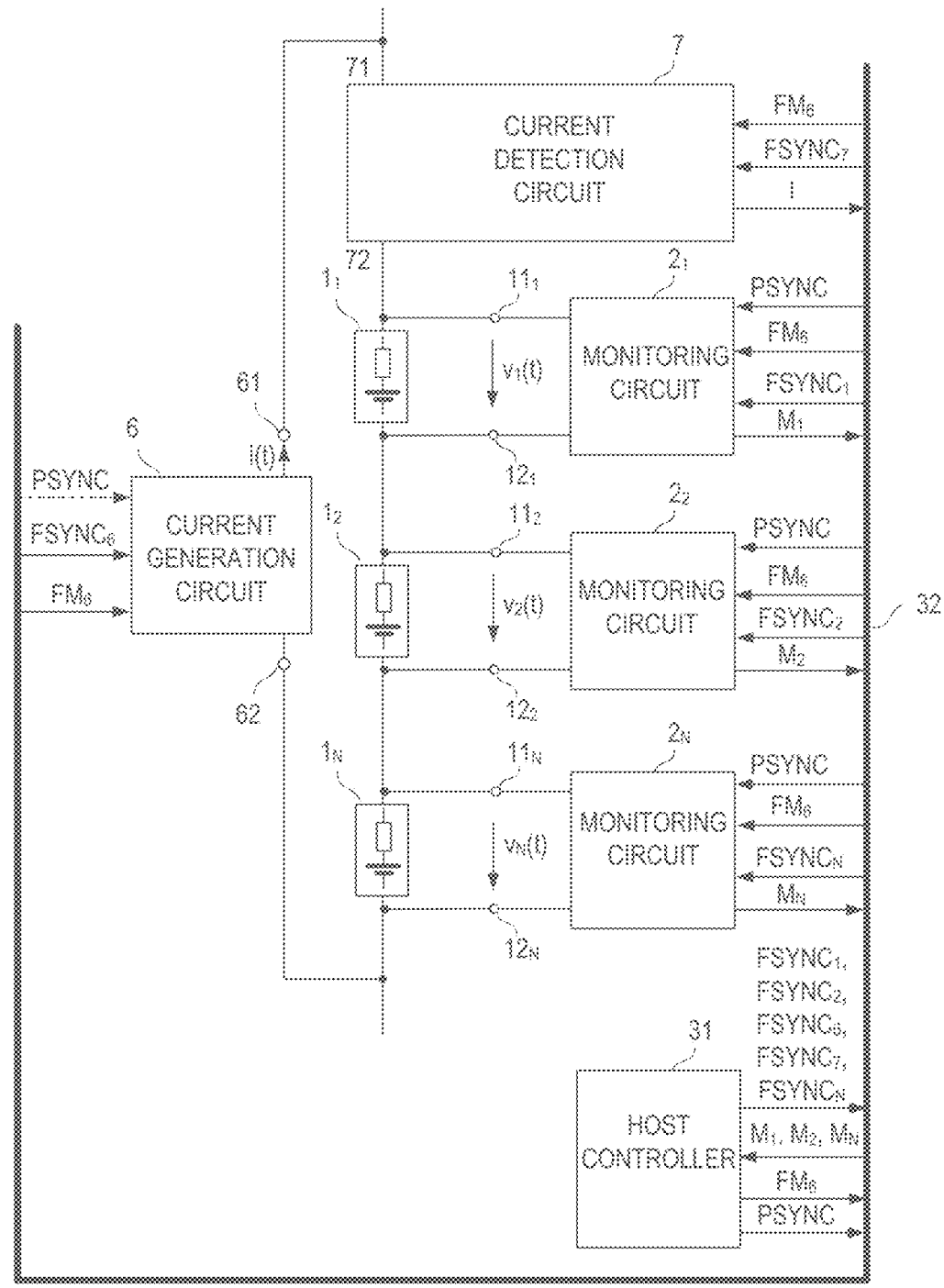
FIG. 17 illustrates one example of a battery monitoring system having a plurality of monitoring circuits, a current source, and a current detection circuit.

FIG. 17 shows a battery monitoring system according to another example. This battery monitoring system is based on the battery monitoring system shown in FIG. 14 and additionally includes a current detection circuit 7 This current detection circuit 7 receives the same measurement frequency information $FM_6$ as the current generation circuit 6 and the monitoring circuits $2_1$-$2_N$ and a frequency synchronization signal $FSYNC_7$ and is configured to measure the current i(t) driven by the current generation circuit 6 into the series circuit with the battery blocks $1_1$-$1_N$. The current detection circuit 7 is configured to measure the complex amplitude I of the current i(t) and transmit a signal representing this complex amplitude I to the host controller 31. Everything that has been explained with regard to the frequency synchronization signals $FSYNC_1$, $FSYNC_2$, $FSYNC_N$ illustrated in FIG. 1 applies to the frequency synchronization signals $FSYNC_1$, $FSYNC_2$, $FSYNC_N$ received by the monitoring circuits $2_1$-$2_N$, the frequency synchronization signal $FSYNC_6$ received by the current generation circuit 6, and the frequency synchronization signal $FSYNC_7$ received by the current detection circuit 7 equivalently. In particular, the frequency synchronization signals $FSYNC_1$, $FSYNC_2$, $FSYNC_N$, $FSYNC_6$, $FSYNC_7$ can be identical or can be different.

Figure 18:
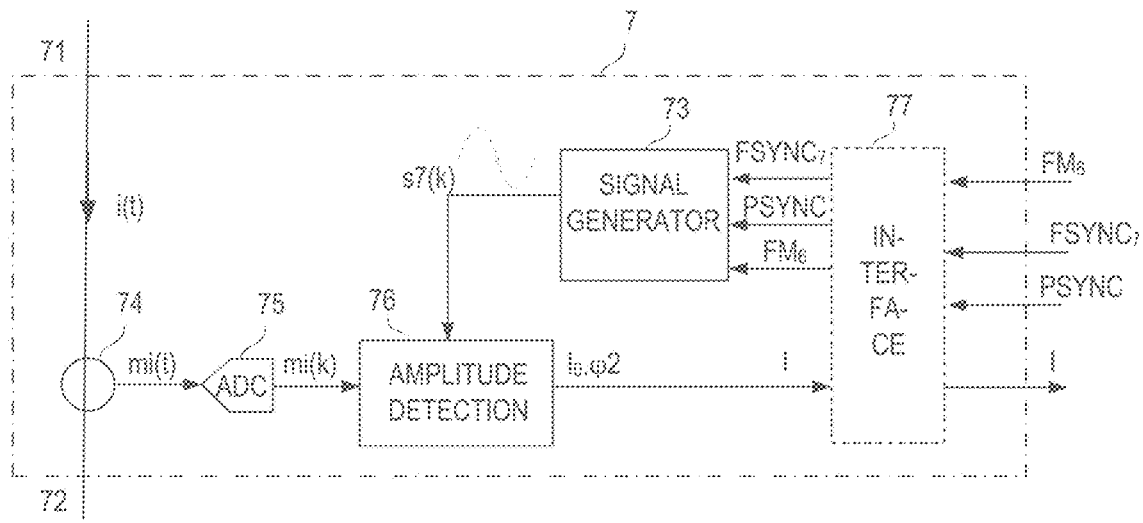
FIG. 18 illustrates one example of a current detection circuit that may be used in a battery monitoring system of the type shown in FIG. 17.

FIG. 18 shows one example of the current detection circuit 7. This current detection circuit 7 includes a signal generator 73 that receives the frequency synchronization signal $FSYNC_7$ and the measurement frequency information $FM_6$ and generates a periodic signal s7(k) with a frequency that is given by the measurement frequency information $FM_6$. The frequency of the periodic signal s7(k) equals the frequency of the periodic signal s6(k) generated in the current generation circuit 6 (see FIG. 15) and the measurement current i(t) because the current detection circuit 7 and the current generation circuit 6 receive the same measurement frequency information $FM_6$. Referring to FIG. 18, a current detection circuit 74 measures the current i(t) between circuit nodes 71, 72 of the current detection circuit 7 and generates a current measurement signal mi(t) that is dependent on the current i(t). According to example, the current measurement signal mi(t) is proportional to the current i(t). An amplitude detector 76 receives the periodic signal s7(k) and the current measurement signal mi(t) and detects the complex amplitude I of the current. According to one example, the amplitude detector 76 is configured to process discrete-time signals. In this example, an ADC 75 generates a discrete-time representation mi(k) of the current measurement signal mi(t). The function of the current detection circuit 74 and the amplitude detector 76 is identical with the function of the current detection circuit 24 and the amplitude detector 5$_2$ in the monitoring circuit 2 shown in FIG. 12 and explained above. The function of the signal generator 73 is very similar to the function of the signal generator 4 shown in FIG. 6 and explained before. Differences between the signal generator 73 shown in FIG. 18 and the signal generator shown in FIG. 6 are explained herein further below.

Figure 19:
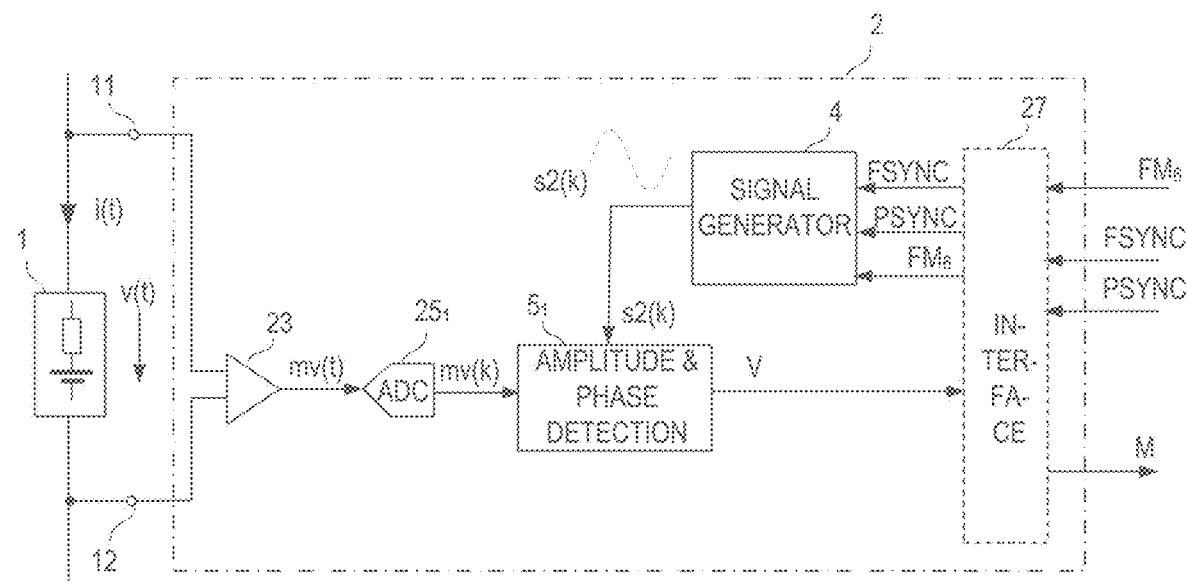
FIG. 19 illustrates one example of a monitoring circuit that may be used in a battery monitoring system of the type shown in FIG. 17.

In the monitoring system shown in FIG. 17, measurement values $M_1$-$M_N$ output by the individual monitoring circuits 2$_1$-2$_N$ represent complex amplitudes of the voltages $v_1(t)$-$v_N(t)$ across the battery blocks 1$_1$-1$_N$. One example of these monitoring circuits 2$_1$-2$_N$ is illustrated in FIG. 19. In FIG. 19, reference number 2 represents an arbitrary one of the monitoring circuits 2$_1$-2$_N$ shown in FIG. 17. The monitoring circuit 2 shown in FIG. 19 is based on the monitoring circuit shown in FIG. 15 and is different from the monitoring circuit 2 shown in FIG. 15 in that the current detection circuit 24 and the second amplitude detector 5$_2$ as well as the optional calculation circuit 26 are omitted.

Figure 20:
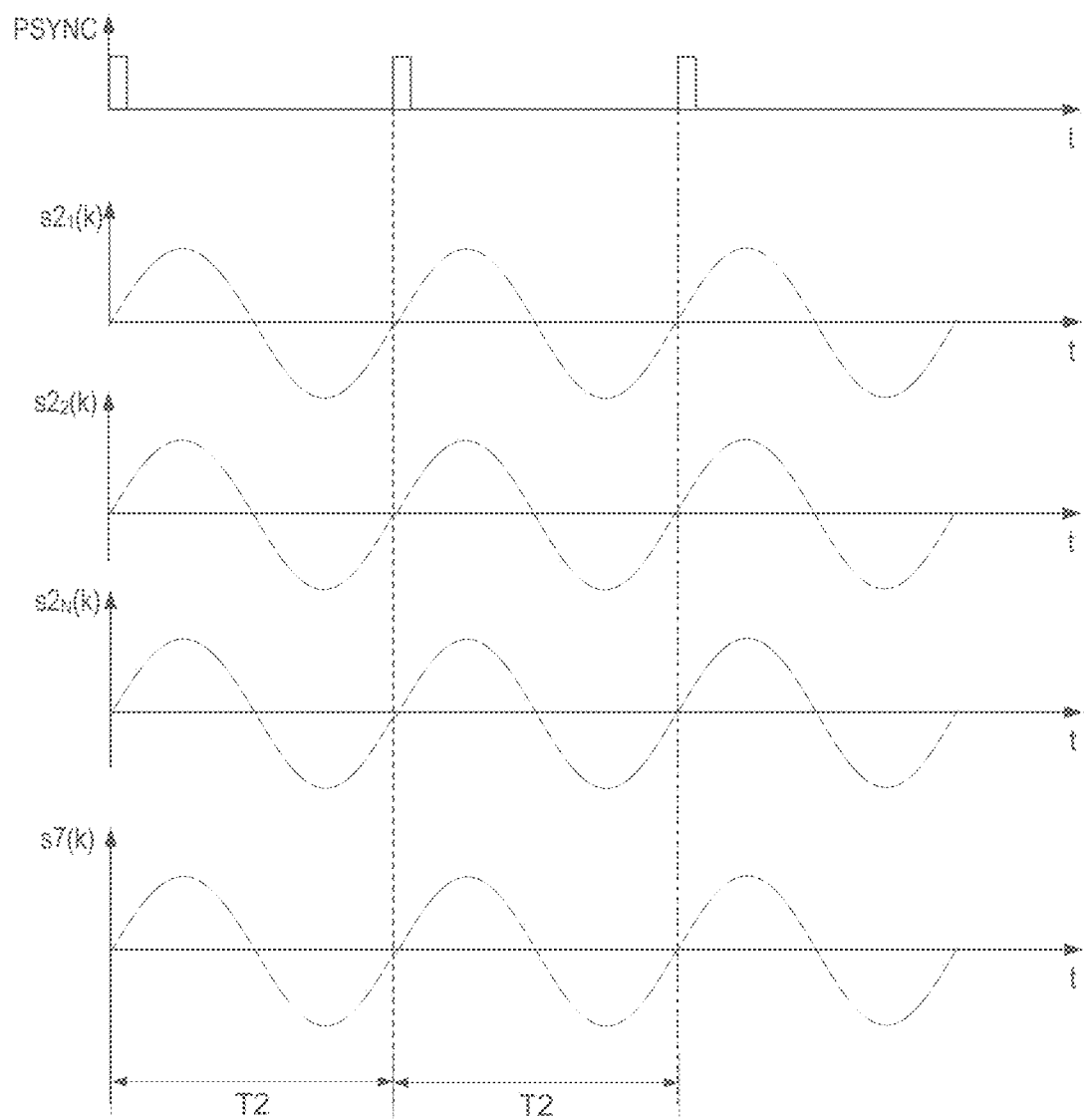
FIG. 20 illustrates one example of how the monitoring circuits, the current source, and the current detection circuit in a battery monitoring system of the type shown in FIG. 17 may be synchronized.

A phase shift between the periodic signal s7(k) generated in the current detection circuit 7 and used to measure the complex amplitude I of the current i(t) and the periodic signals s2$_1$(k)-s2$_N$(k) generated in the monitoring circuits 2$_1$-2$_N$ and used to measure the complex amplitudes V of the voltages across the battery blocks 1$_1$-1$_N$ may result in erroneous measurements of the complex impedances Z of the battery blocks 1$_1$-1$_N$. In the monitoring system according to FIG. 17, the host controller 31 therefore, additionally to the measurement frequency information $FM_6$ and the frequency synchronization signals $FSYNC_1$, $FSYNC_2$, $FSYNC_N$, $FSYNC_6$, $FSYNC_7$, generates a phase synchronization signal PSYNC that is received by each of the monitoring circuits 2$_1$-2$_N$ and the current detection circuit 7. This phase synchronization signal PSYNC causes the current detection circuit 7 and the monitoring circuits 2$_1$-2$_N$ to generate the internal periodic signals such that these signals are in phase with each other. Examples of signal waveforms of the phase synchronization signal PSYNC, the periodic signals s2$_1$(k)-s2$_N$(k) generated inside the monitoring circuits 2$_1$-2$_N$, and the periodic signal s7(k) generated inside the current detection circuit 7 are illustrated in FIG. 20. Just for the purpose of illustration, the phase synchronization signal PSYNC is a pulsed signal and the periodic signals s7(k), s2$_1$(k)-s2$_N$(k) are sinusoidal signals in this example. From the phase synchronization signal PSYNC, only signal pulses are illustrated in FIG. 20. The phase synchronization signal PSYNC may include data packets that are periodically transmitted from the host controller to each of the monitoring circuits 2$_1$-2$_N$ and the current detection circuit 7. These data packets are used as a phase reference by the monitoring circuits 2$_1$-2$_N$ and the current detection circuit 7 and cause the monitoring circuits 2$_1$-2$_N$ and the current detection circuit 7 to generate the respective periodic signals s2$_1$(k)-s2$_N$(k), s7(k) such that each time a data packet (signal pulse) of the phase synchronization signal PSYN is received a phase of the periodic signals s2$_1$(k)-s2$_N$(k), s7(k) is set to a predefined value.

In the example illustrated in FIG. 20, the phase synchronization signal PSYNC includes one signal pulse per period of the periodic signals s2$_1$(k)-s2$_N$(k), s7(k) and the periodic signals s2$_1$(k)-s2$_N$(k), s7(k) are generated such that a new period starts with every signal pulse of the phase synchronization signal PSYNC, that is, the phase of each of the periodic signals s2$_1$(k)-s2$_N$(k), s7(k) is set to 0° when a signal pulse of the phase synchronization signal PSYNC occurs. In this case, the periodic signals s2$_1$(k)-s2$_N$(k), s7(k) are not only in phase with each other, but also in phase with the phase synchronization signal PSYNC. This, however, is only an example. According to another example, the phase of each of the periodic signals is set to value different from 0° such as, for example, 90°, 180° or 270°, each time a signal pulse of the phase synchronization signal PSYNC occurs. In this case, the periodic signals s2$_1$(k)-s2$_N$(k), s7(k) are in phase with each other, but not in phase with the phase synchronization signal PSYNC.

In the example shown in FIG. 20, one signal pulse of the phase synchronization signal PSYNC occurs per period of the, that is, the frequency of the phase synchronization signal PSYNC equals the frequency f2=1/T2 of the periodic signals s2$_1$(k)-s2$_N$(k), s7(k). According to another example (not shown) the frequency of the phase synchronization signal PSYNC is lower than the frequency f2 of the periodic signals s2$_1$(k)-s2$_N$(k), s7(k) so that a signal pulse of the phase synchronization signal PSYNC signal that sets the phases of the periodic signals s2$_1$(k)-s2$_N$(k), s7(k) to a predefined value (0° or different from 0°) occurs only every several periods of the periodic signals s2$_1$(k)-s2$_N$(k), s7(k). According to yet another example, a frequency of the phase synchronization signal PSYNC is an integer multiple of the frequency f2 of the periodic signals s2$_1$(k)-s2$_N$(k), s7(k) so that several signal pulses of the phase synchronization signal PSYNC occur per period of the periodic signals s2$_1$(k)-s2$_N$(k), s7(k), wherein each of these signal pulses is associated with a respective one of several predefined phase. If, for example, the frequency of the phase synchronization signal PSYNC is P times the frequency of the periodic signals, that is, $f_{PSYNC}$=P·f2, wherein $f_{PSYNC}$ is the frequency of the phase synchronization signal PSYNC, in a series of P consecutive signal pulses of the phase synchronization signal PSYNC a first signal pulse is associated with a first predefined phase $\varphi_{PSYNC\_1}$, such as 0°, that is, the first signal pulse sets the phases of the periodic signals s2$_1$(k)-s2$_N$(k), s7(k) to the first predefined phase. A second signal pulse is associated with a second predefined phase $\varphi_{PSYNC\_2}$ that is given by the first predefined phase $D_{PSYNC\_1}$ plus 360°/P, a third signal pulse is associated with a third predefined phase $\varphi_{PSYNC\_3}$ that is given by the second predefined phase $\varphi_{PSYNC\_2}$ plus 360°/P, and so on. In general, an i-th signal pulse, wherein 1≤i≤P, is associated with an i-th predefined phase that is given by $$\varphi_{PSYNC\_i} = \varphi_{PSYNC\_1} + (i-1) \cdot \frac{360°}{P}. \tag{16}$$

In each of these cases, the frequency f2 of the periodic signals s2$_1$(k)-s2$_N$(k), s7(k) is defined by the frequency measurement signal $FM_6$ and deviations of the clock frequencies inside the monitoring circuits 2$_1$-2$_N$ and the current detection circuit 7 are compensated using the frequency synchronization signals $FSYNC_1$-$FSYNC_N$, $FSYNC_6$. Regularly setting the phases of the periodic signals s2$_1$(k)-s2$_N$(k), s7(k) to predefined values by the phase synchronization signal PSYNC helps to counteract phase differences between the periodic signals s2$_1$(k)-s2$_N$(k), s7(k) that may result from slight errors in compensating deviations of the clock frequencies in the individual circuits 2$_1$-2$_N$, 7 from the nominal clock frequency $f_{CLK\_NOM}$. Such errors, in particular, may occur as the clock frequencies may vary over the time.

Figure 21:
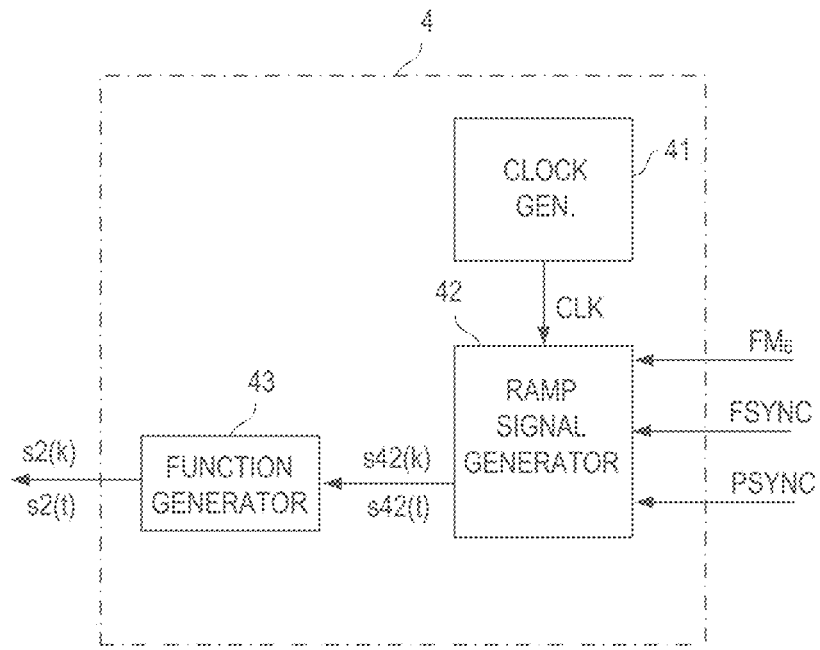
FIG. 21 shows one example of a signal generator that may be used in a monitoring circuit of the type shown in FIG. 19.

FIG. 21 shows one example of the signal generator 4 in the monitoring circuit 2 shown in FIG. 19 that is configured to receive the frequency synchronization signal FSYNC, the measurement frequency information $FM_6$, and the phase synchronization signal PSYNC. The signal generator 73 in the current detection circuit 7 may be implemented in the same way as the signal generator 4 shown in FIG. 21. The signal generator shown in FIG. 21 is based on the signal generator shown in FIG. 6 and is different from the signal generator shown in FIG. 6 in that the ramp signal generator 42 receives the phase synchronization signal PSYNC. One example of the ramp signal generator 42 is shown in FIG. 22.

Figure 22:
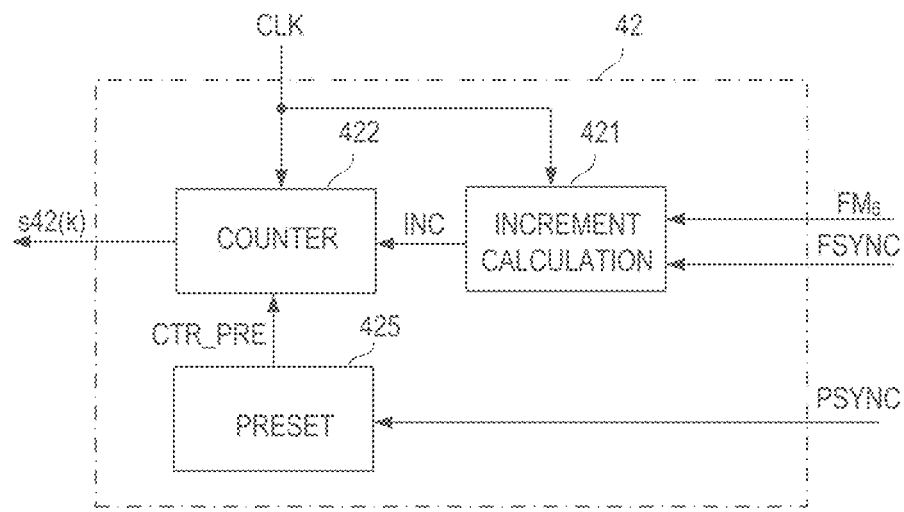
FIG. 22 shows one example of a ramp signal generator that may be implemented in the signal generator shown in FIG. 21.

The ramp signal generator shown in FIG. 22 is based on the ramp signal generator shown in FIG. 9 and additionally includes a preset circuit 425 that receives the phase synchronization signal 425 and is configured to output a counter preset value CTR_PRE that is received by the counter 422. The counter 422 is configured to set its counter value to the counter preset value CTR_PRE each time it receives a counter preset value CTR_PR. Further, the counter 422 is configured to continue counting beginning with the received counter preset value CTR_PRE in accordance with the clock signal CLK. Referring to the above, each signal pulse of the phase synchronization signal PSYNC represents a predefined phase of the periodic signal $s2(k)$. In the signal generator shown in FIGS. 21 and 22 this is obtained in that each signal pulse of the phase synchronization signal PSYNC also represents a predefined phase of the ramp signal $s42(k)$ which, in turn, is obtained in that the preset circuit 425 is configured to generate the counter preset value CTR_PRE such that it represents the predefined phase. For the purpose of illustration it is assumed that a signal pulse of the phase synchronization signal PSYNC received by the preset circuit 425 at one time represents a phase $\varphi_{PSYNC}$ of the ramp signal $s42(k)$ and the periodic signal $s2(k)$. In this case, the preset circuit 425 calculates the counter preset value CTR_PRE as follows:

$$CTR\_PRE = MIN + \frac{\varphi_{PSYNC}}{360°} \cdot (MAX - MIN), \quad (17)$$

where MIN denotes the minimum counter value and MAX denotes the maximum counter value. When, for example, a signal pulse of the phase synchronization signal PSYNC represents a phase of $\varphi_{PSYNC}=0°$ the preset circuit sets the counter preset value to CTR_PRE=MIN.

According to one example, the host controller generates the phase synchronization signal PSYNC such that each data packet (signal pulse) of the phase synchronization signal includes information regarding the phase $P_{SYNC}$ it represents and the preset circuit is configured to generate the counter preset value CTR_PRE based on this information. According to another example, the system is configured such that a first signal pulse of the phase synchronization signal PSYNC generated by the host controller 31 is associated with a predefined phase $\varphi_{SYNC\_0}$, such as 0°, and every further signal pulse is associated with a phase that is given by the phase associated with the directly preceding signal pulse plus a phase difference $\Delta\varphi_{SYNC}$. This phase difference $\Delta\varphi_{SYNC}$ may be fixed and known to the monitoring circuits $2_1$-$2_N$ so that phase information only needs to be transmitted with the first signal pulse, while the phase information associated with the other signal pulses can be obtained from the phase $\varphi_{SYNC\_0}$ associated with the first signal pulse and the number of signal pulses received after the first signal pulse. The phase associated with an i-th signal pulse of the phase synchronization signal PSYNC is, for example, given by $\varphi_{SYNC\_0}+(i-1)\cdot\Delta\varphi_{SYNC}$.

In the examples explained herein before, the frequency synchronization signal FSYNC is used to compensate for variations of the internal clock frequencies of the monitoring circuits $2_1$-$2_N$, the current generation circuit 6, and the current detection circuit 7. In these examples, a duration $T_{SYNC}$ of the synchronization period represented by the frequency synchronization signal FSYNC can be independent of the duration T2 of one period of the periodic signals $s2(k)$, $s6(k)$, $s7(k)$. In particular, the duration $T_{SYNC}$ of the synchronization period represented by the frequency synchronization signal FSYNC can be constant over the time, while the frequency of the periodic signals $s2(k)$, $s6(k)$, $s7(k)$ may change in order to measure the battery blocks $1_1$-$1_N$ at different frequencies. According to one example, in a monitoring system of the type shown in FIG. 17, one and the same signal is used as the phase synchronization signal PSYNC and the frequency synchronization signals $FSYNC_1$-$FSYNC_N$, $FSYNC_6$, $FSYNC_7$. This signal is referred to as phase and frequency synchronization signal PFSYNC in the following.

Figure 23:
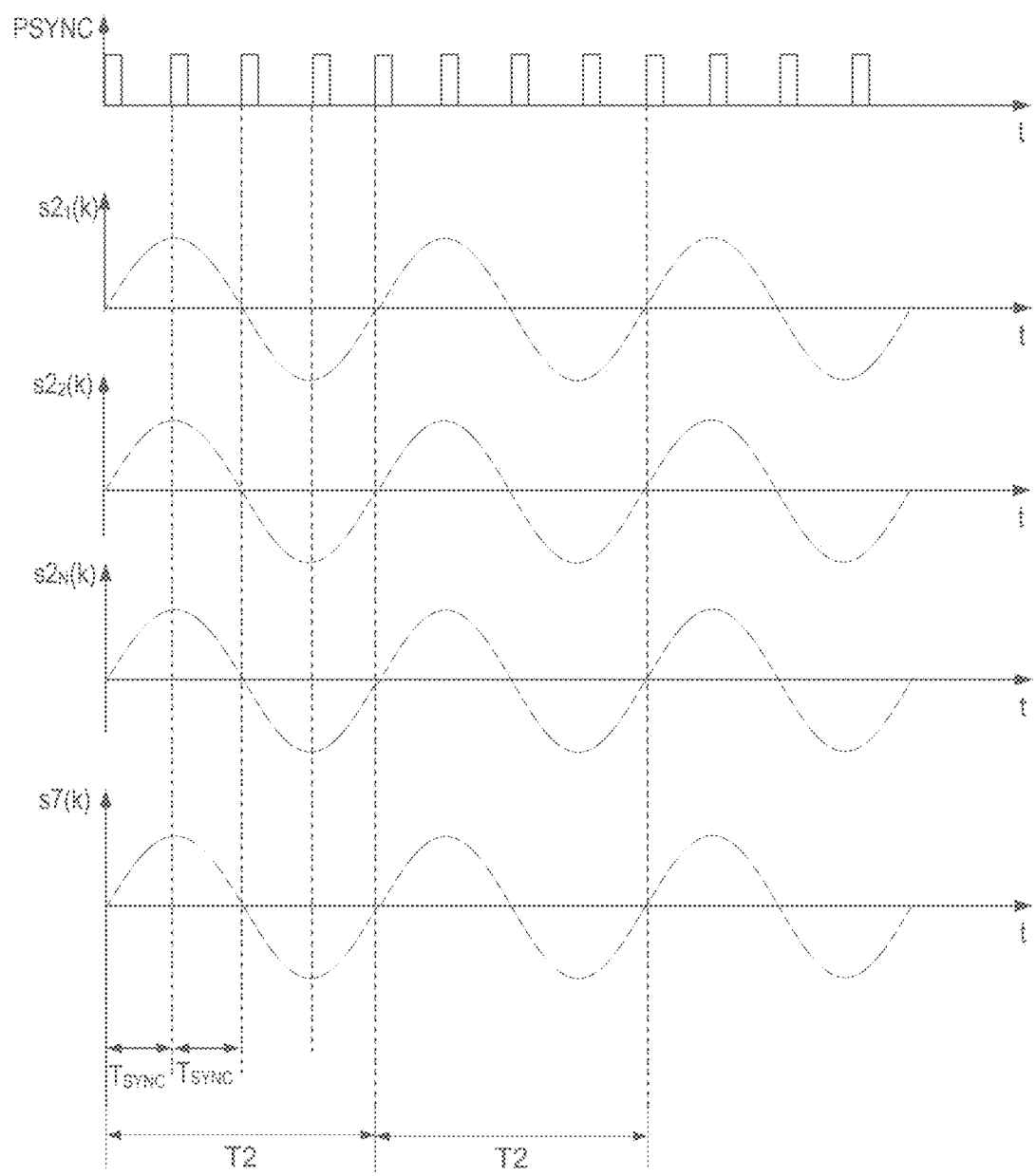
FIG. 23 illustrates signal waveforms of signals occurring in a battery monitoring system of the type shown in FIG. 17.

FIG. 23 shows one example of the phase and frequency synchronization signal PFSYNC and examples of the periodic signals based on this phase and frequency synchronization signal PFSYNC. The phase and frequency synchronization signal PFSYNC has two functions, (a) each of its signal pulses, in the way explained before, defines a predefined phase of the periodic signals $s2_1(k)$-$s2_N(k)$, and $s7(k)$, and (b) each pair of successive signal pulses forms a pair of time marks that define a synchronization period $T_{SYNC}$ that is used to compensate deviations of the clock frequencies from the nominal clock frequency $f_{CLK\_NOM}$ in the monitoring circuits $2_1$-$2_N$, the current generation circuit 6, and the current detection circuit 7. Just for the purpose of illustration, the phase and frequency synchronization signal PFSYNC shown in FIG. 23 includes N=4 signal pulses per period of the periodic signals $s2_1(k)$-$s2_N(k)$, and $s7(k)$, wherein four consecutive signal pulses are associated with phases of 0°, 90°, 180°, and 270° in this example.

In the monitoring system shown in FIG. 17, the current generation circuit 6 generates the current i(t) such that its frequency equals the frequency of the periodic signals $s2_1(k)$-$s2_N(k)$, $s7(k)$ that are internally generated by the monitoring circuits $2_1$-$2_N$ and the current detection circuit 7. Referring to FIG. 17 this can be obtained in that the current generation circuit 6, the monitoring circuits $2_1$-$2_N$, and the current detection circuit 7 receive the same measurement frequency information. Further, the periodic signals $s2_1(k)$-$s2_N(k)$, $s7(k)$ that are internally generated by the monitoring circuits $2_1$-$2_N$ and the current detection circuit 7 are synchronized in that the monitoring circuits $2_1$-$2_N$, and the current detection circuit 7 receive the phase synchronization signal PSYNC. Optionally, the current generation circuit 7 also receives the phase synchronization signal PSYNC (which is illustrated in dashed lines in FIG. 17). In this case, the current generation circuit 6 generates its internal periodic signal $s6(k)$ and the measurement current i(t) such that they are in phase with the periodic signals $s2_1(k)$-$s2_N(k)$, $s7(k)$ internally generated by the monitoring circuits $2_1$-$2_N$ and the current detection circuit 7. This, however, is not mandatory. If the current generation circuit 6 does not receive the phase synchronization signal PSYNC, so that measurement current i(t) is not in phase with the periodic signals s7($k$), s2$_1$($k$)-s2$_N$($k$), the complex amplitude output by the current detection circuit 7 includes a phase error and the complex amplitudes V$_1$-V$_N$ of the battery block voltages v$_1$(t)-v$_N$(t) as represented by the measurement values M$_1$-M$_N$ each includes a phase error. These phase errors, however, are identical so that these phase errors are eliminated when calculating the complex impedances by calculating the quotients between the complex amplitudes V$_1$-V$_N$ of the battery voltages and the complex amplitude I of the measured current.

According to another example, the host controller 31 does not send the measurement frequency information FM$_6$ and the frequency synchronization signal FSYNC$_6$ to the current generation circuit 6, but sends a periodic signal defining frequency, phase and signal waveform of the measurement current i(t) to the current generation circuit 6. In this case, no frequency synchronization in the current generation circuit 6 is required. Further, in this example, the signal generator (63 in FIG. 14) in the current generation circuit may be simplified to only include a controlled current source that is controlled by the periodic signal received from the host controller 31. In this example, the current generation circuit 6, based on the periodic signal received from the host controller 31 generates the phase synchronization signal PSYNC and sends the phase synchronization signal PSYNC to the monitoring circuits 2$_1$-2$_N$ and the current detection circuit 7, which receive the frequency measurement signal FM$_6$ and the frequency synchronization signals FSYNC$_1$-FSYNC$_N$, FSYNC$_7$ from the host controller 31.

In the examples explained above, the frequency synchronization signals and the phase synchronization signal are generated by the host controller 31. This, however, is only an example. According to another example, the current generation circuit 6 includes a precise internal clock generator so that the frequency synchronization signals and/or the phase synchronization signal is/are generated by the current generation circuit 6 and transmitted to the monitoring circuits 2$_1$-2$_N$ and the current detection circuit 7 (if the system includes one). Like in the examples explained herein before, the host controller 31 may generate the frequency measurement signals.

Figure 24:
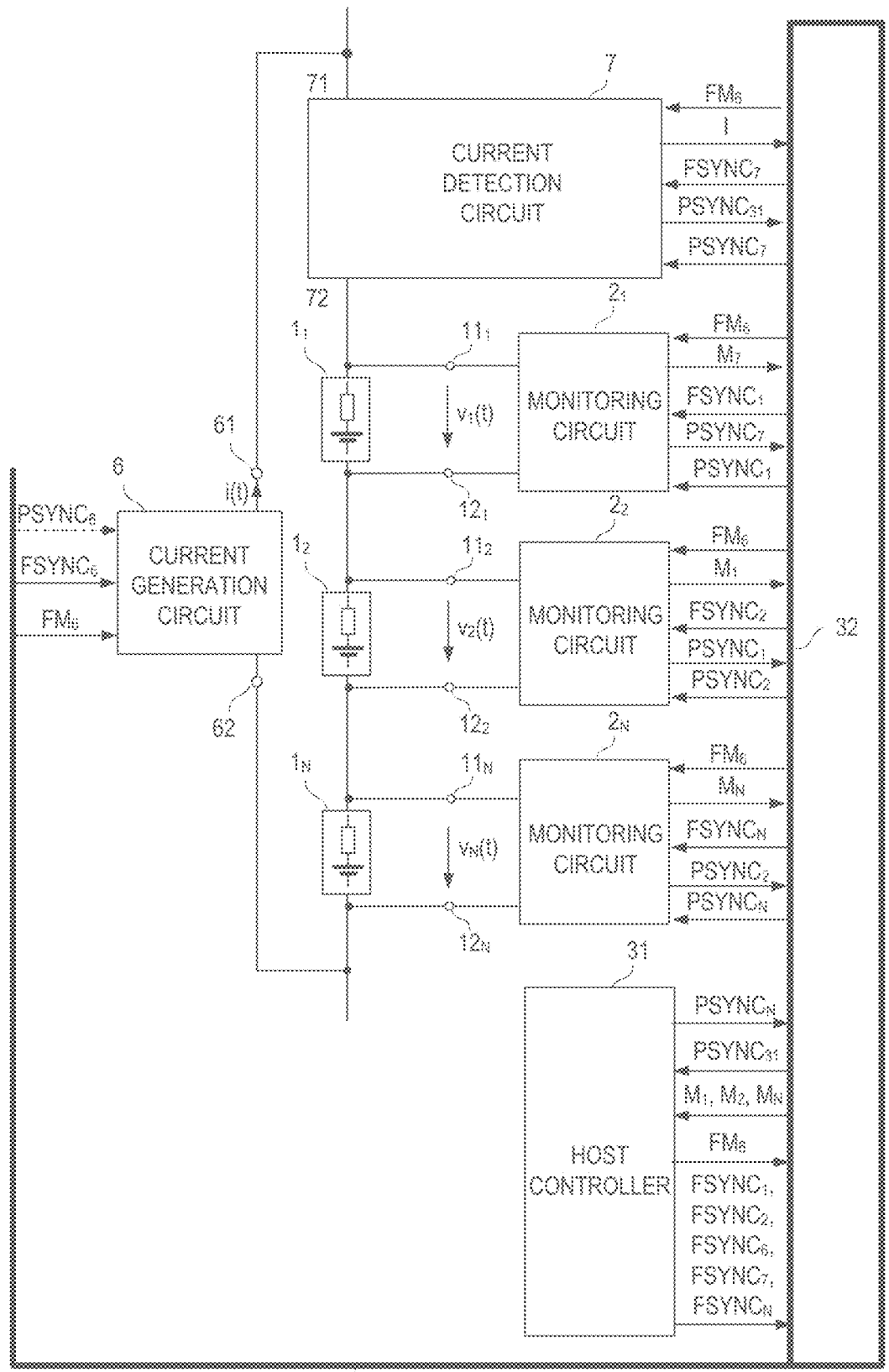
FIG. 24 illustrates another example of a battery monitoring system having a plurality of monitoring circuits, a current source, and a current detection circuit.

FIG. 24 shows a battery monitoring system according to another example. This battery monitoring system is based on the monitoring system shown in FIG. 17 and includes a ring bus as the communication channel 32 for communication between the host controller 31, the monitoring circuits 2$_1$-2$_N$, and the current detection circuit 7 and a further communication channel 33 for communication between the host controller 31 and the current generation circuit 6. The additional channel 33 may be part of the ring channel or may be a separate channel.

In the explanation of the monitoring system of FIG. 17 it has been assumed that the monitoring circuits 2$_1$-2$_N$ and the current detection circuit 7 receive each of the individual pulses of the phase synchronization signal PSYNC at the same time so that the periodic signal s2$_1$($k$)-s2$_N$($k$), s7($k$) are phase synchronized. "At the same time" in this context includes that there may be short time delays between the time instances at which the monitoring circuits 2$_1$-2$_N$ and the current detection circuit 7 receive one signal pulses. Such time delays may cause phase shifts between the periodic signal s7($k$) generated inside the current detection circuit 7 and the periodic signals generated inside the monitoring circuits 2$_1$-2$_N$. A "short time delay" in this context includes a time delay that is less than 0.5% of the duration T2 of one period of the periodic signals s2$_1$($k$)-s2$_N$($k$), s7($k$). time delays may result from different propagation delays, that is, time periods it takes to transmit the phase synchronization signal PSYNC from the host controller 31 to the monitoring circuits 2$_1$-2$_N$ and the current detection circuit 7 may be different.

The monitoring system shown in FIG. 24 is configured to compensate for different propagation delays. This monitoring circuit is different from the monitoring system shown in FIG. 17 in that the host controller 31 determines the individual propagation delays and takes into account these propagation delays in calculating the complex amplitudes of the impedances Z$_1$-Z$_N$, wherein determining the propagation delays includes receiving back the phase synchronization signal by the host controller 31 from one of the monitoring circuits 2$_1$-2$_N$ or from the current detection circuit 7. This is explained in further detail below.

In the monitoring circuit shown in FIG. 24, each of the monitoring circuits 2$_1$-2$_N$ and the current detection circuit 7 receives a phase synchronization signal and forwards the received the phase synchronization signal. The order illustrated in FIG. 24 and explained below in which the monitoring circuits 2$_1$-2$_N$ and the current detection circuit 7 receive and forward the phase synchronization signals is just for the purpose of illustration. This order may be changed in arbitrary fashion. The phase synchronization signals explained in the following serve to adjust phases of the periodic signals s2$_1$($k$)-s2$_N$($k$), s7($k$) generated inside the monitoring circuits 2$_1$-2$_N$. The frequency of these periodic signals s2$_1$($k$)-s2$_N$($k$), s7($k$), as well as the frequency of the measurement current generated by the current generation circuit 6, is defined by the measurement frequency information received by the monitoring circuits 2$_1$-2$_N$, the current detection circuit 7, and the current generation circuit 6 from the host controller. In the monitoring system shown in FIG. 24, the phase synchronization signal is received at different times by the monitoring circuits 2$_1$-2$_N$, the current detection circuit 7, and the host controller 31 so that different reference characters PSYNC$_1$-PSYNC$_N$, PSYNC$_7$, PSYNC$_{31}$ are used to denote the phase synchronization signal.

Figure 25:
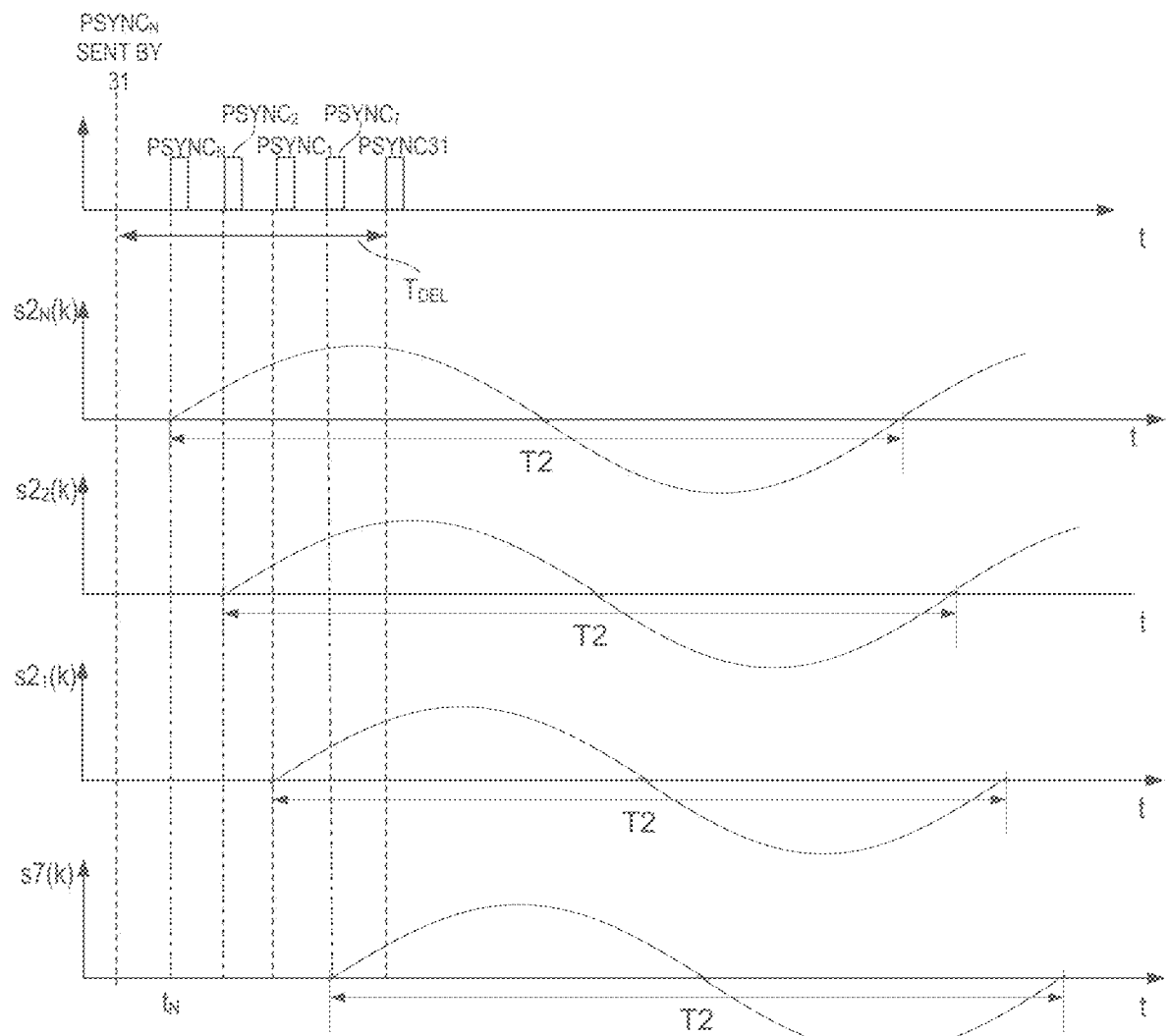
FIG. 25 illustrates signal waveforms of signals occurring in a battery monitoring system of the type shown in FIG. 24.

In the example shown in FIG. 24, the host controller 31 sends the phase synchronization signal PSYNC$_N$ to monitoring circuit 2$_N$. The monitoring circuit 2$_N$ receives the phase synchronization signal PSYNC$_N$ and phase synchronizes generating the periodic signal s2$_N$($k$) to this phase synchronization signal PSYNC$_N$. This is illustrated in FIG. 25 which shows signal waveforms of the phase synchronization signals occurring in the system shown in FIG. 24 and of the periodic signals s2$_1$($k$)-s2$_N$($k$), s7($k$) generated internally by the circuits coupled to the communication channel 32. In FIG. 25, from each of the phase synchronization signals PSYNC$_1$-PSYNC$_N$, PSYNC$_7$ only one signal pulse is shown, wherein this signal pulse is associated with a phase of 0°, that is, periods of the periodic signals s2$_1$($k$)-s2$_N$($k$), s7($k$) start when the respective signal pulse is received. This however, is only an example. These signal pulses can be in the form of data packets, which may be referred to as phase synchronization packets. Each of these packets includes a header addressing the circuit that is to receive the respective packet and a payload information indicating that the data packet is a phase synchronization packet.

Referring to FIG. 25, the monitoring circuit 2$_N$ generates the periodic signal s2$_N$($k$) based on the synchronization signal PSYNC$_N$. In FIG. 25, t$_N$ is the time instance when the signal pulse included in the phase synchronization signal PSYNC$_N$ is received by the monitoring circuit 2$_N$. Just for the purpose of illustration it is assumed that the monitoring circuit 2$_N$ sets the phase of the periodic signal s2$_N$($k$) to the phase value associated with the signal pulse (which is 0° in this example) when the signal pulse is received. However, there may be a delay time (not shown in FIG. 25) between the time instance when the signal pulse is received and the time instance when the phase is set. This time delay can be considered to be the same in each of the monitoring circuits $2_1$-$2_N$ and the current detection circuit 7 so that this time delay has no influence on calculating the impedances $Z_1$-$Z_N$. Further, there may be a delay time between the time instance when the host controller 31 outputs the signal pulse and the time instance $t_N$ when the monitoring circuit $2_N$ receives the signal pulse.

Referring to FIGS. 24 and 25, the monitoring circuit $2_N$ forwards the phase synchronization signal PSYNC$_N$ received from the host controller 31 to the monitoring circuit $2_2$ (wherein PSYNC$_2$ denotes the phase synchronization signal output by monitoring circuit $2_N$ and received by monitoring circuit $2_2$). Further, monitoring circuit $2_2$ forwards the phase synchronization signal PSYNC$_2$ received from the monitoring circuit $2_N$ to the monitoring circuit $2_1$ (wherein PSYNC$_1$ denotes the phase synchronization signal output by monitoring circuit $2_2$ and received by monitoring circuit $2_1$) and monitoring circuit $2_1$ forwards the phase synchronization signal PSYNC$_1$ received from the monitoring circuit $2_2$ to the current detection circuit 7 (wherein PSYNC$_7$ denotes the phase synchronization signal output by monitoring circuit $2_1$ and received by the current detection circuit 7).

Finally, the current detection circuit 7 forwards the phase synchronization signal PSYNC$_7$ received from the monitoring circuit $2_1$ to the host controller 31 (wherein PSYNC$_{31}$ denotes the phase synchronization signal output by the current detection circuit 7 and received by the host controller 31). This phase synchronization signal PSYNC$_{31}$ output by the current detection circuit 7 to the host controller 31 is not used for synchronization purposes but is used by the host controller 31 to correct phases of the measurement signals received from the current detection circuit 7 and the monitoring circuits $2_1$-$2_N$. This is explained in the following.

In the monitoring system shown in FIG. 24, the measurement value output by the current detection circuit 7 is the complex amplitude I of the current i(t) flowing through the series circuit with the battery blocks $1_1$-$1_N$. This complex amplitude is given by $$I = I_0 \cdot e^{j\varphi 7} \quad (18)$$

where φ7 is a phase shift that may result from the fact that the periodic signal s7(k) generated in the current detection circuit 7 to detect the complex amplitude I may not be in phase with the periodic signal s6(k) generated in the current generation circuit 6 and, therefore, not in phase with the measurement current. The measurement values $M_1$-$M_N$ output by the monitoring circuits represent complex amplitudes of the voltages across the associated battery block $1_1$-$1_N$. The complex amplitude $M_i$ output by an arbitrary one $2_i$ of these monitoring circuits is given by $$M_i = V_i = V_{0i} \cdot e^{j\varphi i} \quad (19),$$

where $V_{oi}$ is the magnitude and φi is the phase. This phase results from a phase shift φ1i introduced by the battery block $1_i$ (the complex impedance $Z_i$ of the battery block $1_i$ causes a phase shift between the current i(t) flowing through the battery block $1_i$ and the voltage across the battery block) and from a phase shift φ2i between the periodic signal s$2_i$(k) (see, FIG. 25) used in the monitoring circuit $2_1$ to detect the complex amplitude $V_i$ and the measurement current i(t), that is, $$\varphi i = \varphi 2i + \varphi 1i \quad (20).$$

The phase shift φ2i between the periodic signal s$2_i$(k) and the measurement current i(t) is given by the phase shift φ7 between the measurement current i(t) and the periodic signal s7(k) generated inside the current detection circuit 7 plus a phase shift Δθ between the periodic signals s7(k) and s$2_i$(k) generated in the current detection circuit 7 and the monitoring circuit $2_i$, that is, $$\varphi 2i = \varphi 7 - \Delta\theta \quad (21).$$

Referring to the above, calculating the complex impedance $Z_i$ of battery block $1_i$ includes calculating the quotient of the complex amplitude $V_i$ of the battery block voltage $v_i(t)$ received from the monitoring circuit $2_i$ and the complex amplitude I of the current i(t) received from the current detection circuit 7. Based on equations (18) to (21) the complex impedance $Z_i$ is given by $$Z_i = \frac{V_i}{I} = \left(V_{0i} \cdot e^{j(\varphi 1i + \varphi 7 - \Delta\theta)}\right) / \left(I_0 \cdot e^{j\varphi 7}\right) = \frac{V_{0i}}{I_0} \cdot e^{j(\varphi 1i - \Delta\theta)}. \quad (22)$$

From equation (22) it can be seen that the complex amplitude $Z_i$ does not include a phase error resulting from the fact that the periodic signals s7(k) and s$2_i$(k) are not in phase with the measurement current i(t). However, the complex amplitude $Z_i$ of the impedance may include the phase error AO resulting from the fact that the periodic signals s7(k) and s$2_i$(k) are not in phase. In the monitoring system shown in FIG. 24, the host controller 31 is configured to correct this phase error AO in a way outlined below. More specifically, the host controller calculates a correction value cv and corrects the phase φ1i-Δθ obtained from equation (22) by adding the correction value cv, so that the corrected phase of the complex impedance $Z_i$ is given by φ1i-Δθ+cv. Ideally, the correction value cv equals the phase shift Δθ so that the phase of the complex impedance is only given by the phase shift φI introduced by the battery block $1_i$.

Calculating the correction value cv by the host controller 31 includes calculating a time difference $\Delta T_i$ between a time instance when the synchronization pulse PSYNC7 is received by the current detection circuit 7 and the time when the synchronization pulse PSYNC$_i$ is received by the monitoring circuit $2_i$. According to one example, calculating this time difference includes detecting a delay time $T_{DEL}$ between a time when the host controller 31 sends out the signal pulse of the phase synchronization signal PSYNC$_N$ and a time when the host controller 31 receives the signal pulse PSYNC$_{31}$ from the current detection circuit 7 in the communication chain. In the example illustrated in FIG. 21, the communication chain goes from the host controller 31 to the monitoring circuit 2N, from the monitoring circuit $2_N$ to the monitoring circuit $2_2$, from the monitoring circuit $2_2$ to the monitoring circuit $2_1$, from the monitoring circuit $2_1$ to the current detection circuit 7, and from the current detection circuit 7 back to the host controller 31. Calculating the time difference further includes taking into account positions of the current detection circuit 7 and the monitoring circuit $2_i$ relative to each other in the communication chain. Let P7 be the position of the current detection circuit 7 and let P$2_i$ be the position of the monitoring circuit $2_i$ in the communication chain. The time difference $\Delta T_i$ is then given by $$\Delta T_i = \frac{P7 - P2i}{C + 1} \cdot (T_{DEL}), \quad (23)$$

where C is the overall number of circuits in the communication chain. In the example shown in FIG. 21, the overall number of circuits is four (C=4), the current detection circuit 7 is the fourth circuit in the communication chain (P7=4), and the monitoring circuits $2_1$-$2_N$ are at position 3 to 1 in the communication chain so that $P2_i$ is one of 1, 2, or 3. Calculating the time difference $\Delta T_i$ in accordance with equation (23) is based on the assumption that the delay times between two neighboring circuits in the communication chain are essentially the same (namely $T_{DEL}/(C+1)$). Based on the calculated time difference $\Delta T_i$ the phase correction value cv is calculated by the host controller 31 as follows:

$$cv = s \cdot 2\pi(f2) \cdot \Delta T_i \quad (24),$$

where f2 is the measurement frequency represented by the measurement frequency information $FM_6$, that is, the frequency of the periodic signals $S7(k)$, $s2_i(k)$ and the measurement current i(t). Further, s defines the sign of the correction value. The correction value cv is positive (s=+1) if the current detection circuit 7 is downstream the monitoring circuit $2_i$ in the communication chain, and the correction value cv is negative if the current detection circuit 7 is upstream the monitoring circuit $2_i$ in the communication chain.

In the example explained above, detecting the delay time $T_{DEL}$ includes detecting the delay between sending out a signal pulse of the phase synchronization signal $PSYNC_N$ by the host controller 31 to the monitoring circuit $2_N$ and receiving a respective signal pulse of the phase synchronization signal $PSYNC_{31}$ by the host controller 31. In this case, the phase synchronization signals occurring in the system have two functions: (a) phase synchronizing the generation of the periodic signals $s2_1(k)$-$s2_N(k)$, $s7(k)$ in the monitoring circuits $2_1$-$2_N$ and the current detection circuit 7, and (b) supporting the host controller 31 in detecting the delay time in order to enable the host controller 31 to correct possible phase errors. According to another example, the phase synchronization signals are only used to phase synchronize the generation of the periodic signals $s2_1(k)$-$s2_N(k)$, $s7(k)$ in the monitoring circuits $2_1$-$2_N$ and the current detection circuit 7, while a further signal, which may be referred to as delay detection signal, is used to detect the delay. This delay detection signal is generated such that it includes one or more signal pulses that travel from the host controller 31 along the bus 32 through the monitoring circuits $2_1$-$2_N$ and the current detection circuit 7 and back to the host controller 31, in the same way as explained with regard to the phase synchronization signals in context with FIG. 24. In other words, the host controller 31 uses the delay detection signal in order to detect the delay $T_{DEL}$ wherein the phase synchronization signals illustrated in FIGS. 24 and 25 are one specific example of such delay detection signal.

Figure 26:
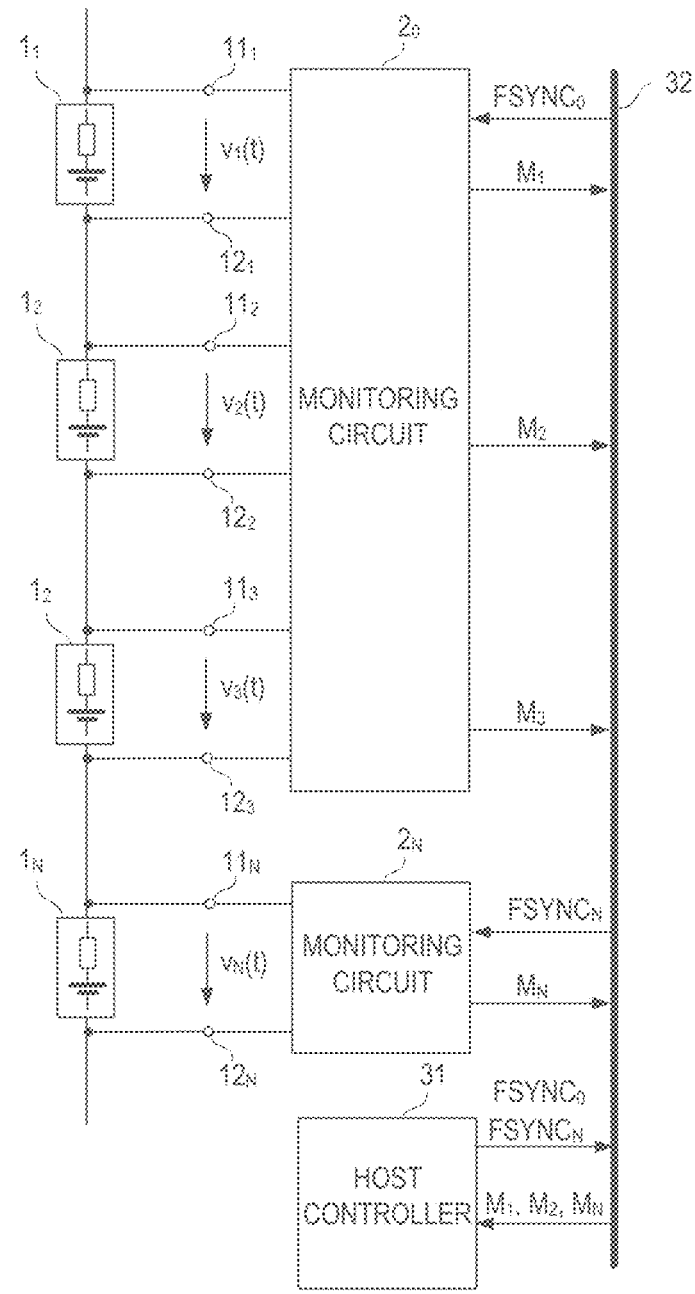
FIG. 26 illustrates another example of a battery monitoring system.

In the examples explained before, each of the monitoring circuits $2_1$-$2_N$ is associated with one battery block and at least measures the voltage across the associated battery block. This, however, is only an example. According to another example illustrated in FIG. 26, one monitoring circuit 20 may be coupled to more than battery blocks $1_1$-$1_3$ and, in a multiplexed fashion, may at least measure the voltages $v_1(t)$-$v_3(t)$ across these battery blocks $1_1$-$1_3$.

What is claimed is:

1. A battery monitoring circuit comprising:
    a ramp signal generator configured to produce a ramp signal in accordance with digital input received from a host controller, where the digital input defines an output range of the ramp signal and a time period of the ramp signal;
    a function generator having a phase control input coupled to an output of the ramp signal generator, the function generator configured to produce a periodic output having a phase based on a value of the phase control input, wherein a waveform of the periodic output is different from the ramp signal and comprises at least one complete periodic cycle within a single ramp portion of the ramp signal;
    an interface circuit configured to apply the output of the function generator to a battery cell: and
    an amplitude detector coupled to an output of the function generator and configured to be coupled to the battery cell, the amplitude detector configured to measure an amplitude of a current or a voltage of the battery cell at a frequency produced by the function generator.

2. The battery monitoring circuit of claim 1, wherein the interface circuit comprises a current signal generator configured to apply a periodic current to the battery cell, wherein the periodic current is based on the periodic output of the function generator.

3. The battery monitoring circuit of claim 1, wherein the function generator comprises an oscillator.

4. The battery monitoring circuit of claim 3, wherein the oscillator is less accurate than an oscillator used by the host controller.

5. The battery monitoring circuit of claim 1, wherein the amplitude detector comprises:
    a first multiplier having a first input configured to be coupled to the battery cell and a second input coupled to an output of the function generator; and
    a first low pass filter coupled to an output of the first multiplier.

6. The battery monitoring circuit of claim 5, wherein the amplitude detector further comprises an analog to digital converter having an input configured to be coupled to the battery cell and an output coupled to the first input of the first multiplier.

7. The battery monitoring circuit of claim 5, wherein the amplitude detector further comprises:
    a phase shifter having an input coupled to the output of the function generator;
    a second multiplier having a first input configured to be coupled to the battery cell, and a second input coupled to an output of the phase shifter; and
    a second low pass filter coupled to an output of the second multiplier.

8. The battery monitoring circuit of claim 5, wherein the amplitude detector comprises:
    a current measurement circuit configured to be coupled to the battery cell; or
    a voltage measurement circuit configured to be coupled to the battery cell.

9. The battery monitoring circuit of claim 1, wherein the ramp signal generator comprises:
    a counter having an output coupled to the output of the ramp signal generator; and
    an increment calculator having an output coupled to an input of the counter, when increment calculator configured to determine a count increment based on the digital input.

10. The battery monitoring circuit of claim 1, wherein the digital input further comprises a phase synchronization signal defining the phase of the periodic output of the function generator.

11. The battery monitoring circuit of claim 10, wherein the ramp signal generator comprises:

a counter having an output coupled to the output of the ramp signal generator;

an increment calculator having an output coupled to an input of the counter, when increment calculator configured to determine a count increment based on the output range of the ramp signal and the time period defined by the digital input; and a preset circuit coupled to the counter, the preset circuit configured to preset the counter according to the phase defined by the phase synchronization signal.

12. The battery monitoring circuit of claim 1, wherein the waveform of the periodic output is sinusoidal.

13. The battery monitoring circuit of claim 1, wherein the waveform of the periodic output comprises an integer number of cycles within a single ramp period of the ramp signal.

14. A battery monitoring circuit comprising:

a ramp signal generator configured to produce a ramp signal in accordance with digital input received from a host controller, where the digital input defines an output range of the ramp signal and a time period of the ramp signal;

a function generator having a phase control input coupled to an output of the ramp signal generator, the function generator configured to produce a periodic output having a phase based on a value of the phase control input; and an amplitude detector coupled to an output of the function generator and configured to be coupled to a battery cell, the amplitude detector configured to measure an amplitude of a current or a voltage of the battery cell at a frequency produced by the function generator, wherein the amplitude detector comprises:

a first multiplier having a first input configured to be coupled to the battery cell and a second input coupled to an output of the function generator, a first low pass filter coupled to an output of the first multiplier, a phase shifter having an input coupled to the output of the function generator, a second multiplier having a first input configured to be coupled to the battery cell, and a second input coupled to an output of the phase shifter, and a second low pass filter coupled to an output of the second multiplier.

15. A method comprising:

using a ramp signal generator, producing a ramp signal in accordance with digital input received from a host controller, where the digital input defines an output range of the ramp signal and a time period of the ramp signal;

using a function generator having a phase control input coupled to an output of the ramp signal generator, producing a periodic output having a phase based on a value of the phase control input, wherein a waveform of the periodic output is different from the ramp signal and comprises at least one complete periodic cycle within a single ramp portion of the ramp signal;

using an interface circuit, applying the output of the function generator to a battery cell; and using an amplitude detector coupled to an output of the function generator and configured to be coupled to the battery cell, measuring an amplitude of a current or a voltage of the battery cell at a frequency produced by the function generator.

16. The method of claim 15, further comprising applying a periodic current to the battery cell using the interface circuit, wherein the periodic current is based on the periodic output of the function generator.

17. The method of claim 15, further comprising applying an output of a clock generator to the ramp signal generator, wherein the clock generator is less accurate than an oscillator used by the host controller.

18. The method of claim 15, wherein using the amplitude detector comprises:

multiplying an output of the battery cell and an output of the function generator using a first multiplier; and filtering an output of the first multiplier using a first low pass filter.

19. The method of claim 18, further comprising performing an analog to digital conversion of the output of the battery cell using an analog to digital converter, and providing an output of the analog to digital converter to a first input of the first multiplier.

20. The method of claim 18, wherein using the amplitude detector further comprises:

shifting a phase of the output of the function generator using a phase shifter;

multiplying the output of battery cell and an output of the phase shifter using a second multiplier; and filtering an output of the second multiplier using a second low pass filter.

21. The method of claim 18, wherein using the amplitude detector comprises:

measuring a current of the battery cell using a current measurement circuit; or measuring a voltage of the battery cell using a voltage measurement circuit.

22. The method of claim 15, further comprising, receiving, by the ramp signal generator a phase synchronization signal defining the phase of the periodic output of the function generator.

* * * * *